(12) United States Patent
Honda

(10) Patent No.: US 11,652,048 B2
(45) Date of Patent: May 16, 2023

(54) SEMICONDUCTOR DEVICE AND METHOD FOR FORMING THE STRUCTURE OF WORD-LINE AVOIDING SHORT CIRCUIT THEREOF

(71) Applicant: MICRON TECHNOLOGY, INC., Boise, ID (US)

(72) Inventor: Harutaka Honda, Higashihiroshima (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 170 days.

(21) Appl. No.: 17/202,110

(22) Filed: Mar. 15, 2021

(65) Prior Publication Data

US 2022/0293510 A1   Sep. 15, 2022

(51) Int. Cl.
*H01L 23/528* (2006.01)
*G11C 8/14* (2006.01)
*H10B 12/00* (2023.01)
*H10B 20/00* (2023.01)

(52) U.S. Cl.
CPC .............. *H01L 23/528* (2013.01); *G11C 8/14* (2013.01); *H10B 12/00* (2023.02); *H10B 12/50* (2023.02); *H10B 20/60* (2023.02)

(58) Field of Classification Search
CPC . H01L 23/528; H01L 27/0207; H01L 27/108; H01L 27/10897; H01L 27/1116; H01L 27/11286; H01L 2924/1438; G06F 30/00; G11C 8/14
See application file for complete search history.

(56) References Cited

U.S. PATENT DOCUMENTS

| | | | |
|---|---|---|---|
| 6,495,870 B1 * | 12/2002 | Sekiguchi | G03F 1/36 257/E27.081 |
| 2012/0037970 A1 * | 2/2012 | Park | H01L 28/91 257/296 |
| 2012/0086063 A1 * | 4/2012 | Taniguchi | H01L 27/10814 257/300 |
| 2014/0021632 A1 * | 1/2014 | Lee | H01L 27/11573 257/774 |
| 2014/0377934 A1 * | 12/2014 | Takesako | H01L 27/10888 438/675 |

* cited by examiner

*Primary Examiner* — Galina G Yushina
(74) *Attorney, Agent, or Firm* — Dorsey & Whitney LLP

(57) ABSTRACT

A semiconductor device includes a substrate, a memory cell region, a peripheral region adjacent to the memory cell region, a plurality of word-lines extending across the memory cell region and the peripheral region, and a plurality of contacts connected to edge portions of even numbered ones of the plurality of word-lines in the peripheral region, respectively.

14 Claims, 43 Drawing Sheets

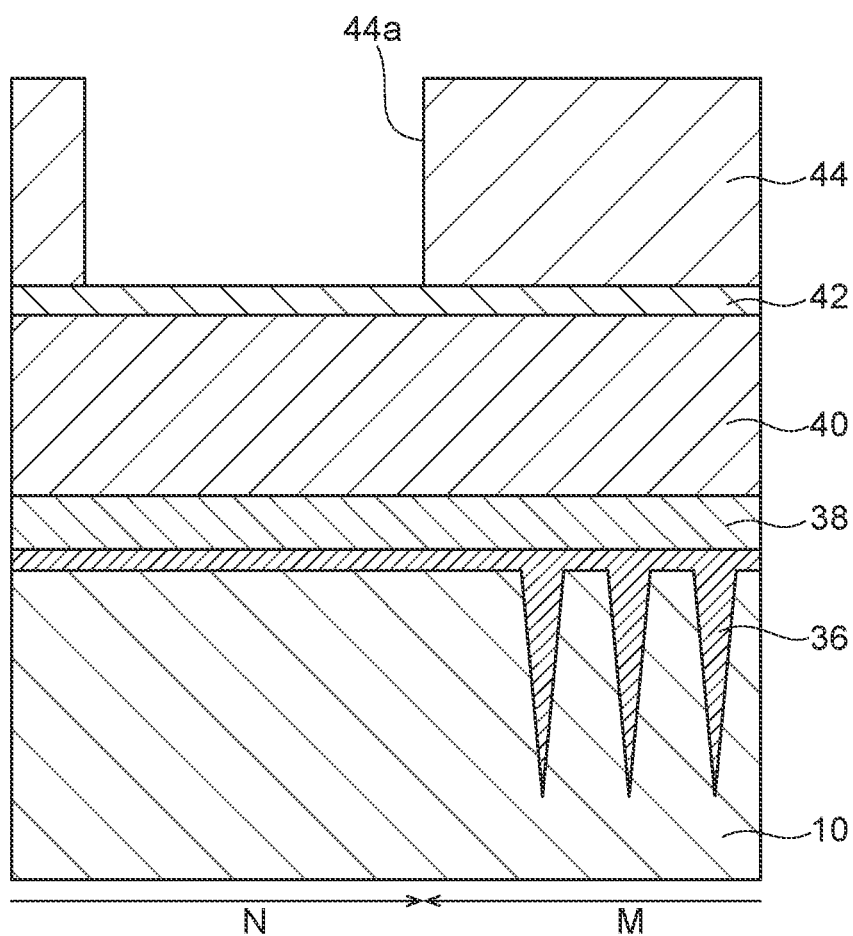

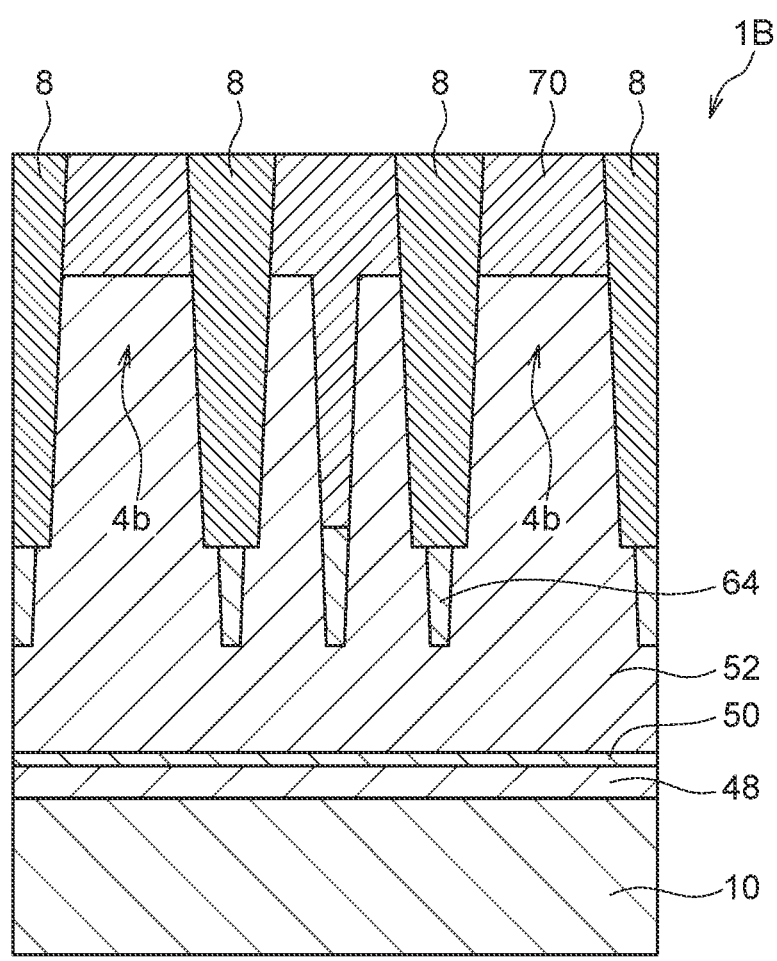

SEMICONDUCTOR DEVICE AND METHOD FOR FORMING THE STRUCTURE OF WORD-LINE AVOIDING SHORT CIRCUIT THEREOF

BACKGROUND

In semiconductor devices such as dynamic random access memory (hereinafter referred to as DRAM) for example, circuit features are becoming increasingly finer in order to increase the data storage capacity. For example, the size of the repeating pitch of wiring such as DRAM word-lines is being reduced, and the distance between word-lines is also being reduced. However, when forming contact electrodes to be connected to the word-lines, if the positioning is misaligned with the word-lines, the contact electrodes may form a short circuit with neighboring word-lines in some cases.

BRIEF DESCRIPTION OF THE DRAWINGS

FIG. 5A is a plan view illustrating an example of the schematic configuration in an exemplary process stage. FIG. 5B is a longitudinal section view illustrating the schematic configuration of the portions along the lines A-A, B-B, and C-C in FIG. 5A.

FIG. 6A is a plan view illustrating an example of the schematic configuration in an exemplary process stage. FIG. 6B is a longitudinal section view illustrating the schematic configuration of the portions along the lines A-A, B-B, and C-C in FIG. 6A.

FIG. 7A is a plan view illustrating an example of the schematic configuration in an exemplary process stage. FIG. 7B is a longitudinal section view illustrating the schematic configuration of the portions along the lines A-A, B-B, and C-C in FIG. 7A.

FIG. 8A is a plan view illustrating an example of the schematic configuration in an exemplary process stage. FIG. 8B is a longitudinal section view illustrating the schematic configuration of the portions along the lines A-A, B-B, and C-C in FIG. 8A.

FIG. 9A is a plan view illustrating an example of the schematic configuration in an exemplary process stage. FIG. 9B is a longitudinal section view illustrating the schematic configuration of the portions along the lines A-A and C-C in FIG. 9A. FIG. 9C is a longitudinal section view illustrating the schematic configuration of the portion along the line B-B in FIG. 9A.

FIG. 10A is a plan view illustrating an example of the schematic configuration in an exemplary process stage. FIG. 10B is a longitudinal section view illustrating the schematic configuration of the portions along the lines A-A and C-C in FIG. 10A. FIG. 10C is a longitudinal section view illustrating the schematic configuration of the portion along the line B-B in FIG. 10A.

FIG. 11A is a plan view illustrating an example of the schematic configuration in an exemplary process stage. FIG. 11B is a longitudinal section view illustrating the schematic configuration of the portions along the lines A-A and C-C in FIG. 11A. FIG. 11C is a longitudinal section view illustrating the schematic configuration of the portion along the line B-B in FIG. 11A.

FIG. 12A is a plan view illustrating an example of the schematic configuration in an exemplary process stage. FIG. 12B is a longitudinal section view illustrating the schematic configuration of the portion along the line A-A in FIG. 12A. FIG. 12C is a longitudinal section view illustrating the schematic configuration of the portion along the line B-B in FIG. 12A. FIG. 12D is a longitudinal section view illustrating the schematic configuration of the portion along the line C-C in FIG. 12A. FIG. 12E is a longitudinal section view illustrating the schematic configuration of the portion along the line D-D in FIG. 12A.

FIG. 13A is a plan view illustrating an example of the schematic configuration in an exemplary process stage. FIG. 13B is a longitudinal section view illustrating the schematic configuration of the portion along the line A-A in FIG. 13A. FIG. 13C is a longitudinal section view illustrating the schematic configuration of the portion along the line B-B in FIG. 13A. FIG. 13D is a longitudinal section view illustrating the schematic configuration of the portion along the line C-C in FIG. 13A.

FIG. 14A is a plan view illustrating an example of the schematic configuration in an exemplary process stage. FIG. 14B is a longitudinal section view illustrating the schematic configuration of the portion along the line A-A in FIG. 14A. FIG. 14C is a longitudinal section view illustrating the schematic configuration of the portion along the line B-B in FIG. 14A. FIG. 14D is a longitudinal section view illustrating the schematic configuration of the portion along the line C-C in FIG. 14A. FIG. 14E is a longitudinal section view illustrating the schematic configuration of the portion along the line D-D in FIG. 14A.

FIGS. 15A to 15F illustrate an example of the schematic configuration an exemplary process stage following the process stage illustrated in FIGS. 14A to 14E. FIG. 15A is a plan view illustrating an example of a schematic configuration of the semiconductor device according to the first embodiment. FIG. 15B is a longitudinal section view illustrating the schematic configuration of the portion along the line A-A in FIG. 15A. FIG. 15C is a longitudinal section view illustrating the schematic configuration of the portion along the line B-B in FIG. 15A. FIG. 15D is a longitudinal section view illustrating the schematic configuration of the portion along the line C-C in FIG. 15A. FIG. 15E is a longitudinal section view illustrating the schematic configuration of the portion along the line D-D in FIG. 15A. FIG. 15F is a longitudinal section view illustrating the schematic configuration of the portion along the line E-E in FIG. 15A.

FIG. 16A is a plan view illustrating an example of the schematic configuration in an exemplary process stage. HG. 16B is a longitudinal section vie illustrating the schematic configuration of the portions along the lines A-A and C-C in FIG. 16A. FIG. 16C is a longitudinal section view illustrating the schematic configuration of the portion along the line B-B in FIG. 16A.

FIG. 17A, is a plan view illustrating an example of the schematic configuration exemplary process stage. FIG. 17B is a longitudinal section view illustrating the schematic configuration of the portions along the lines A-A and C-C in FIG. 17A. FIG. 17C is a longitudinal section view illustrating the schematic configuration of the portion along the line B-B in FIG. 17A.

FIG. 18A is a plan view illustrating an example of the schematic configuration in an exemplary process stage. FIG. 18B is a longitudinal section view illustrating the schematic configuration of the portions along the lines A-A and C-C in FIG. 18A. FIG. 18C is a longitudinal section view illustrating the schematic configuration of the portion along the line B-B in FIG. 18A.

FIG. 19A is a plan view illustrating an example of the schematic configuration in an exemplary process stage. FIG. 19B is a longitudinal section view illustrating the schematic configuration of the portions along the lines A-A and C-C in FIG. 19A. FIG. 19C is a longitudinal section view illustrating the schematic configuration of the portion along the line B-B in FIG. 19A.

FIGS. 20A to 20C are diagrams illustrating a method of forming the semiconductor device according to the second embodiment, and illustrate an example of the schematic configuration in an exemplary process stage following the process stage illustrated in FIGS. 19A to 19C. FIG. 20A is a plan view illustrating an example of the schematic configuration in an exemplary process stage. FIG. 20B is a longitudinal section view illustrating the schematic configuration of the portions along the lines A-A and C-C in FIG. 20A. FIG. 20C is a longitudinal section view illustrating the schematic configuration of the portion along the line B-B in FIG. 20A.

FIG. 21A is a plan view illustrating an example of the schematic configuration in an exemplary process stage. FIG. 21B is a longitudinal section view illustrating the schematic configuration of the portions along the lines A-A and C-C in FIG. 21A. FIG. 21C is a longitudinal section view illustrating the schematic configuration of the portion along the line B-B in FIG. 21A.

FIG. 22A is a plan view illustrating an example of the schematic configuration in an exemplary process stage. FIG. 22B is a longitudinal section view illustrating the schematic configuration of the portions along the lines A-A and C-C in FIG. 22A. FIG. 22C is a longitudinal section view illustrating the schematic configuration of the portion along the line B-B in FIG. 22A.

FIG. 23A is a plan view illustrating an example of the schematic configuration in an exemplary process stage. FIG. 23B is a longitudinal section view illustrating the schematic configuration of the portion along the line A-A in FIG. 23A. FIG. 23C is a longitudinal section view illustrating the schematic configuration of the portion along the line B-B in FIG. 23A.

FIG. 23D is a longitudinal section view illustrating the schematic configuration of the portion along the line C-C in FIG. 23A.

FIG. 24A is a plan view illustrating an example of the schematic configuration in an exemplary process stage. FIG. 24B is a longitudinal section view illustrating the schematic configuration of the portion along the line A-A in FIG. 24A. FIG. 24C is a longitudinal section view illustrating the schematic configuration of the portion along the line B-B iii FIG. 24A. FIG. 24D is a longitudinal section view illustrating the schematic configuration of the portion along the line C-C in FIG. 24A.

FIG. 25A is a plan view illustrating an example of the schematic configuration in an exemplary process stage. FIG. 25B is a longitudinal section view illustrating the schematic configuration of the portion along the line A-A in FIG. 25A. FIG. 25C is a longitudinal section view illustrating the schematic configuration of the portion along the line B-B in FIG. 25A. FIG. 25D is a longitudinal section view illustrating the schematic configuration of the portion along the line C-C in FIG. 25A. FIG. 25E is a longitudinal section view illustrating the schematic configuration of the portion along the line D-D in FIG. 25A.

FIGS. 26A to 26F are diagrams illustrating the semiconductor device according to the first embodiment and a method of forming the same. FIGS. 26A to 26F illustrate an example of the schematic configuration in an exemplary process stage following the process stage illustrated in FIGS. 25A to 25E. FIG. 26A is a plan view illustrating an example of the schematic configuration in an exemplary process stage. FIG. 26B is a longitudinal section view illustrating the schematic configuration of the portion along the line A-A in FIG. 26A. FIG. 26C is a longitudinal section view illustrating the schematic configuration of the portion along the line B-B in FIG. 26A. FIG. 26D is a longitudinal section view illustrating the schematic configuration of the portion along the line C-C in FIG. 26A. Fla 26E is a longitudinal section view illustrating the schematic configuration of the portion along the line D-D in FIG. 26A. FIG. 26F is a longitudinal section view illustrating the schematic configuration of the portion along the line E-E in FIG. 26A.

DETAILED DESCRIPTION

Figure 1:
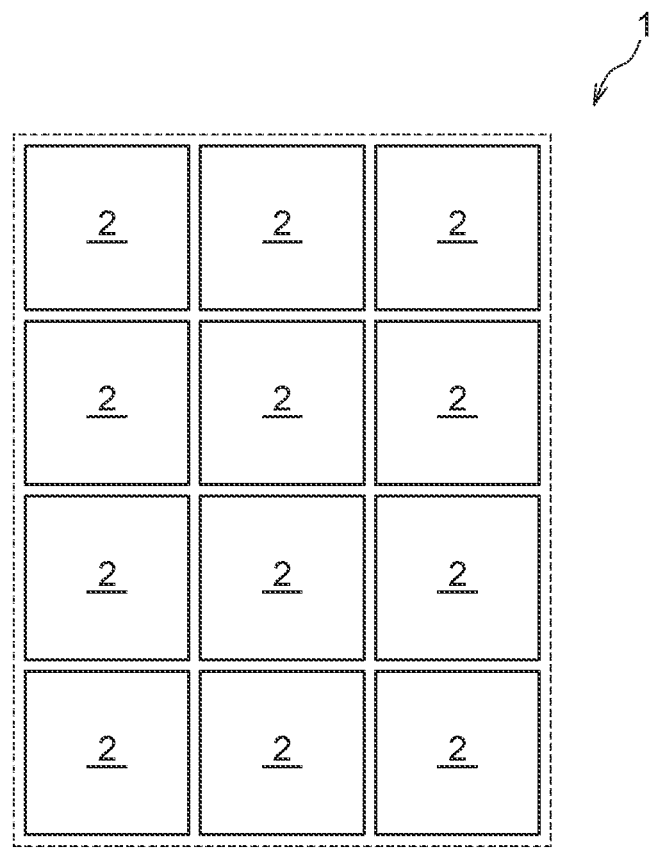
FIG. 1 is a plan view illustrating a schematic configuration of part of a memory cell region of a semiconductor device according to first and second embodiments.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, several embodiments will be described with reference to the drawings. In the following description, DRAM is given as an example of a semiconductor device 1 (1A, 1B). FIGS. 1 to 4 illustrate a configuration of a semiconductor device according to a first embodiment and a second embodiment described later.

In the following description, a semiconductor device 1 includes a semiconductor device 1A according to the first embodiment and the semiconductor device 1B according to the second embodiment. The semiconductor device will be denoted by 1A when describing the first embodiment, and denoted by 1B when describing the second embodiment. In each of the embodiments illustrated hereinafter, common elements, related elements, or elements that are substantially the same will be denoted with the same signs, and a description will be omitted. In the drawings referenced hereinafter, the dimensions and dimensional ratios of each unit in each drawing do not necessarily match the dimensions and dimensional ratios in the embodiments. Also, the vertical direction in the description hereinafter means the vertical direction in the case of orienting the configuration so that a semiconductor substrate 10 is on the bottom.

First Embodiment

Hereinafter, the semiconductor device 1 (1A) and a method of forming the same according to the first embodiment will be described with reference to FIGS. 1 to 15F.

Figure 1A:
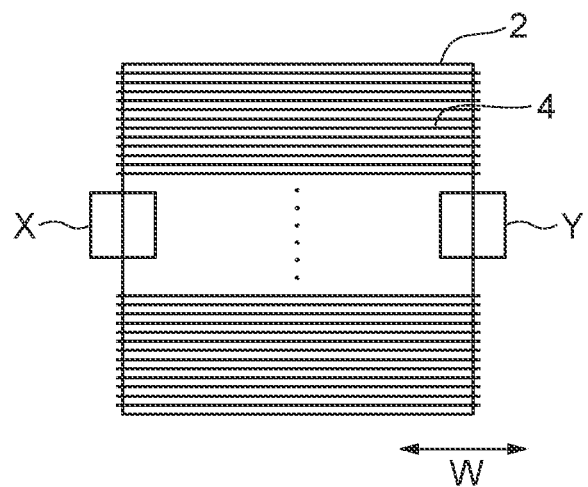
FIG. 1A is a plan view illustrating a schematic configuration of a memory mat.
Figure 2:
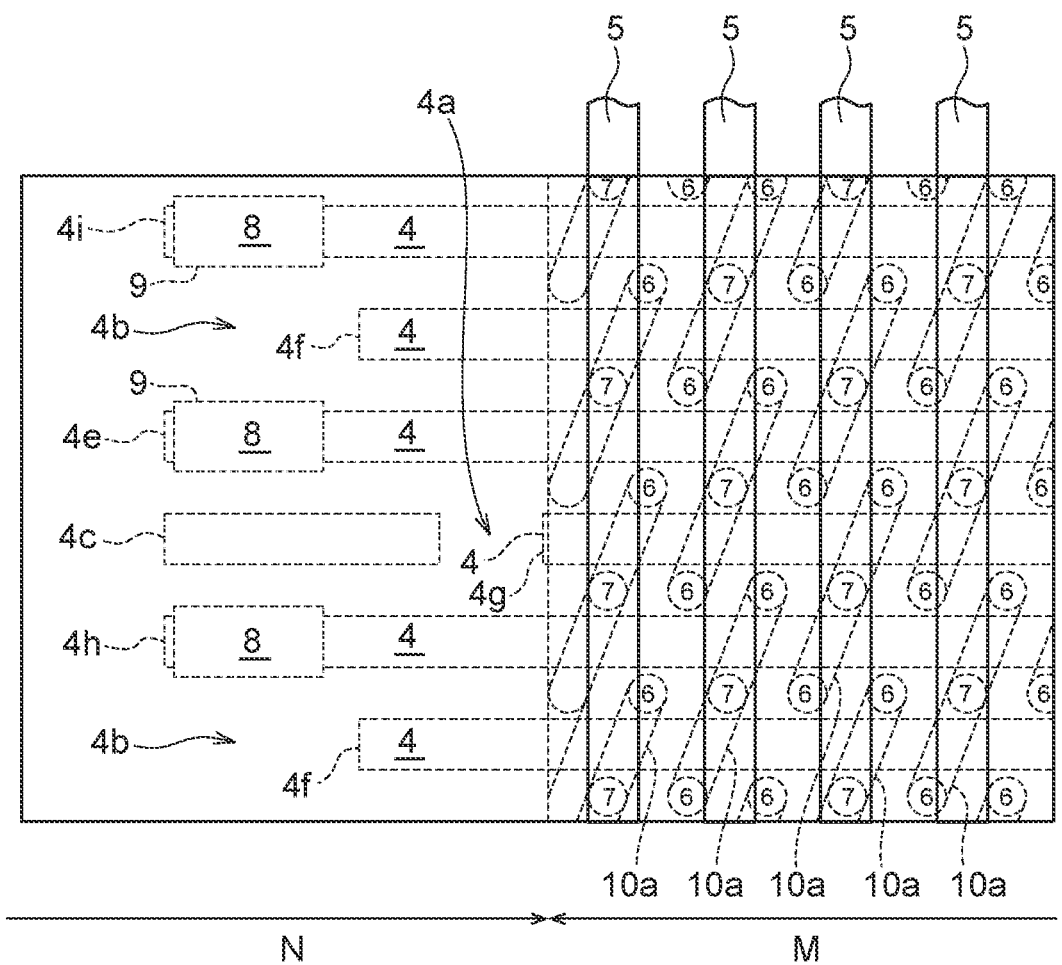
FIG. 2 is a plan-view layout diagram illustrating a schematic configuration of the memory cell region of the semiconductor device according to the first and second embodiments, and is an enlarged view of the memory mat end region X in FIG. 1A.
Figure 3:
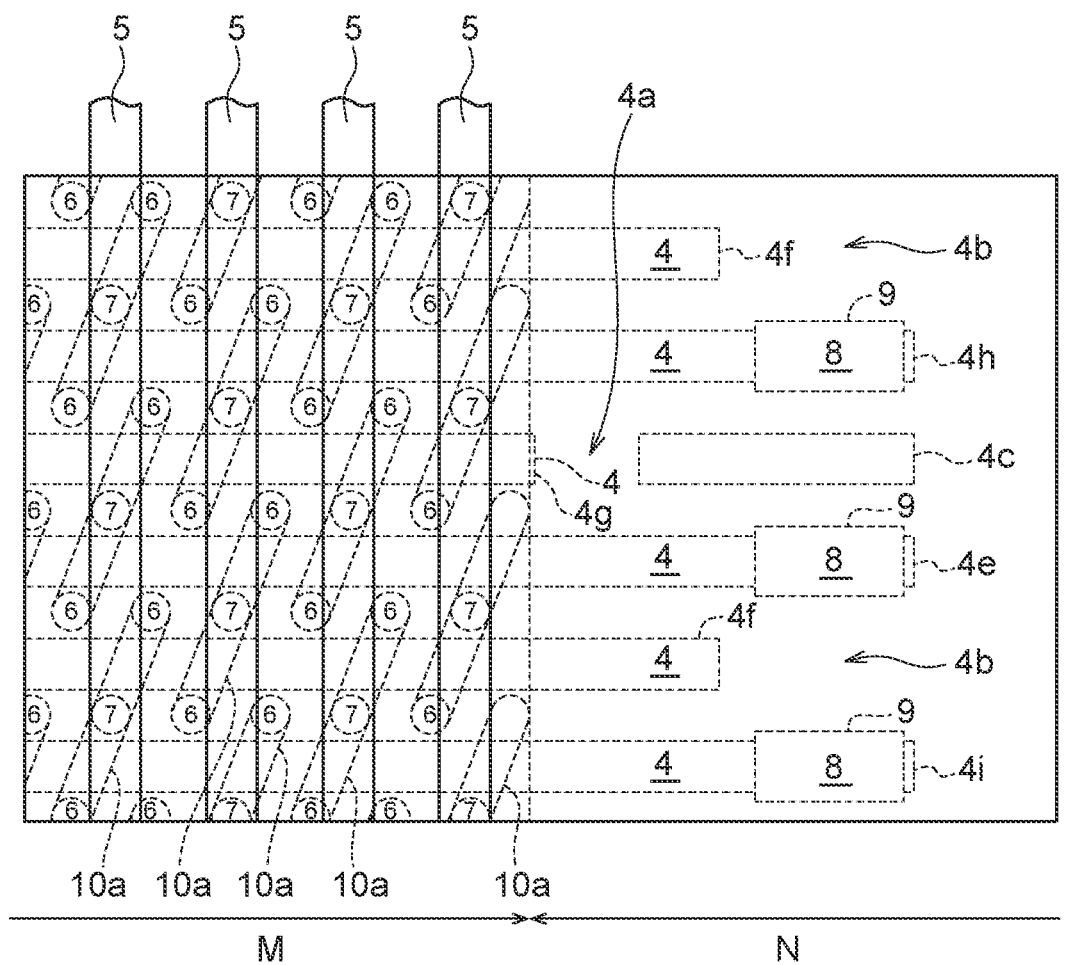
FIG. 3 is a plan-view layout diagram illustrating a schematic configuration of the memory cell region of the semiconductor device according to the first and second embodiments, and is an enlarged view of the memory mat end region Yin FIG. 1A.

FIGS. 1 to 3 are diagrams illustrating a plan-view layout of the semiconductor device 1 (1A) according to the first embodiment. As illustrated in FIG. 1, the semiconductor device 1 includes a plurality of memory mats 2 disposed in a matrix on the surface of a semiconductor substrate. As illustrated in FIG. 1A, a plurality of word-lines 4 are disposed in parallel in each of the memory mats 2.

The direction parallel to the word-lines 4 is designated the word-line direction W. A memory mat end region X and a memory mat end region Y are disposed at the ends in the word-line direction W of each memory mat 2. The end of each word-line 4 is connected to a row decoder not illustrated. Row addresses selected when reading from or writing to a memory cell are input into the word-lines 4 from the row decoder. Each of the plurality of word-lines 4 is paired (e.g., coupled) with corresponding ones of a plurality of memory cells, and controls accesses to the corresponding memory cells among the plurality of memory cells.

FIG. 2 is a layout diagram illustrating an enlarged view of the memory mat end region X in FIG. 1A. FIG. 3 is a layout diagram illustrating an enlarged view of the memory mat end region Y in FIG. 1A. As illustrated in FIG. 2, in the memory mat end region X, the semiconductor device 1 includes a memory cell region M and a peripheral region N. In the memory cell region M, a plurality of word-lines 4 and a plurality of bit lines 5 are disposed orthogonally at equal pitch. Active regions 10a included in the memory cells are disposed at the intersection points between the word-lines 4 and the bit lines 5. The word-lines 4 include word-lines 4e, 4f, 4g, 4h, and 4i described hereinafter.

The longitudinal direction of the active regions 10a is inclined at a predetermined angle with respect to the bit lines 5. The word-lines 4 function as the gate electrode of an access transistor of the memory cells in the active regions 10a. The bit lines 5 are connected to a central part of the active regions 10a through bit line contacts 7. In the active regions 10a, capacitor contacts 6 are disposed on the opposite side of the word-lines 4 from the bit line contacts 7. Capacitors not illustrated are connected to the capacitor contacts 6.

The word-lines 4 are disposed so as to extend straight across from the memory cell region M to the peripheral region N. In the peripheral region N, word-line contacts 8 electrically connected to the word-lines 4 (4e, 4h, 4i) are provided. The word-line contacts 8 are connected to the word-lines 4 (4e, 4h, 4i) at edge portions 9 of the word-lines 4. The edge portions 9 correspond to overlapping portions where the word-lines 4 and the word-line contacts 8 overlap. In the peripheral region N, the word-line contacts 8 are connected to every other word-line 4 (4e, 4h, 4i). Word-lines 4 (4f, 4g) not connected to the word-line contacts 8 are disposed adjacent to the word-lines 4 (4e, 4h, 4i) connected to the word-line contacts 8. The word-line 4g has an offcut 4c. The word-line 4g is adjacent on one side of the word-line 4e connected to one of the word-line contacts 8. The offcut 4c is disposed beside the edge portion 9 of the word-line 4e.

Between the offcut 4c and the word-line 4g a first portion 4a where a word-line 4 does not exist is disposed. The first portion 4a is disposed near the boundary between the memory cell region M and the peripheral region N. The word-line 4g and the offcut 4c are isolated physically and electrically by the first portion 4a. The offcut 4c is not connected to any of the word-lines 4, and is electrically floating. On the extension line of the other word-line 4f not connected to a word-line contact 8, a second portion 4b where a word-line 4 is missing and does not exist is provided beside the word-line contacts 8.

As illustrated in FIG. 2, in the memory mat end region X, the word-lint 4e is sandwiched between the word-line 4f and the word-line 4g. The word-line 4h having a configuration similar to the word-line 4e is disposed adjacent to the word-line 4g. The word-line 4g is sandwiched by the word-line 4e and the word-line 4h. The word-line 4i having a configuration similar to the word-line 4e is disposed adjacent to the word-line 4f. The word-line 4f is sandwiched by the word-line 4e and the word-line 4i. The plurality of word-lines 4 (4e to 4i) are arranged in the order described above, and are subsequently arranged in repetitions of the above order. In the memory mat end region Y, the word-lines 4e, 4h, and 4i are longer than the word-line 4f. The word-line 4f is longer than the word-line 4g. The word-line 4f has the second portion 4b where the word-lines 4 does not exist, adjacent to the edge portion 9 of one of the word-lines 4 (4e or 4h). The word-line 4g has the offcut 4c adjacent to the edge portion 9 of one of the word-lines 4 (4e or 4h). The word-lines 4 (4e, 4h, 4i) connected to the word-line contacts 8 do not have the first portion 4a or the second portion 4b.

The plan-view layout of the memory mat end region Y illustrated in FIG. 3 is a layout in which the word-lines 4e, 4h, and 4i are swapped with the word-lines 4f and 4g compared to that of the memory mat end region X. If the word-lines 4e, 4h, and 4i in the memory mat end region X are defined as even-numbered word-lines 4, then the word-lines 4f and 4g are odd-numbered word-lines 4. In this case, the word-line contacts 8 are connected to the even-numbered word-lines 4. The odd-numbered word-lines 4 have the second portion 4b or the offcut 4c. The memory mat end region Y has a layout in which the even-numbered word-lines and the odd-numbered word-lines in the memory mat end region X are swapped. The word-lines 4 (4e, 4h, and 4i) connected to the word-line contacts 8 in the peripheral region N of the memory mat end region X have a configuration similar to the word-lines 4 (4f or 4g) not connected to the word-line contacts 8 in memory mat end region Y. The word-lines 4f and 4g in the peripheral region N of the memory mat end region X have a configuration similar to the word-lines 4 (4e, 4h, or 4i) connected to the word-line contacts 8 in the memory mat end region Y. The rest of the configuration of the memory mat end region Y is substantially the same as the configuration of the memory mat end region X.

Figure 4:
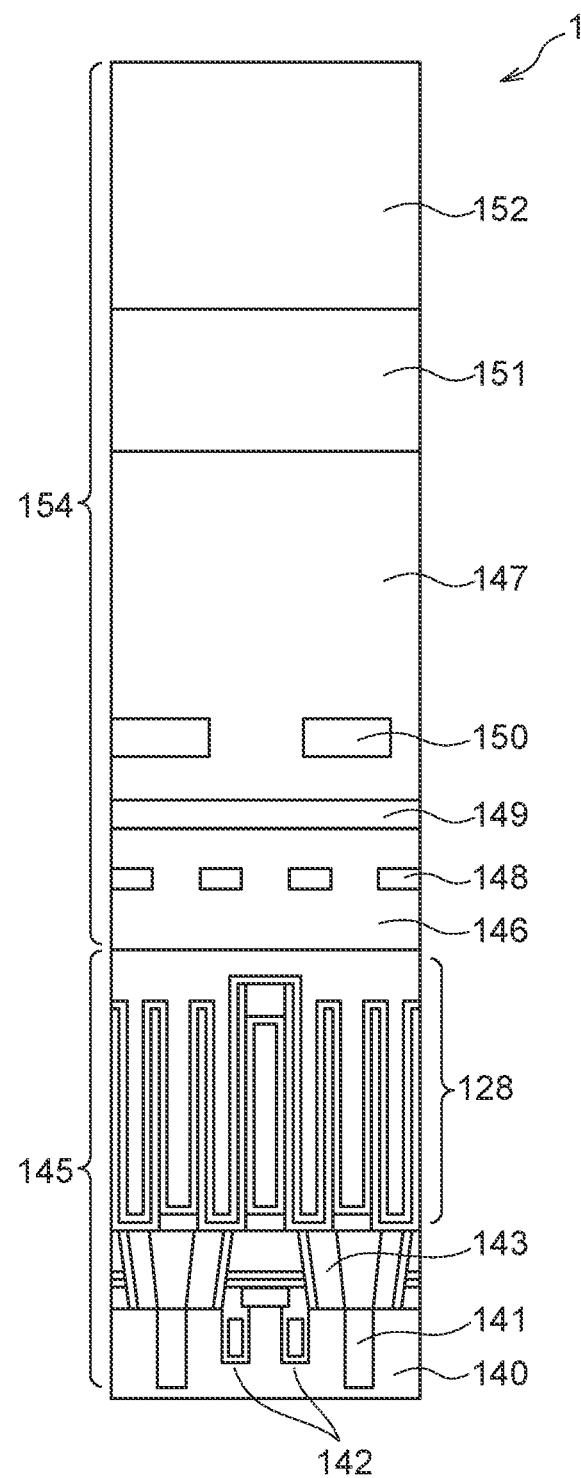
FIG. 4 is a longitudinal section view illustrating an example of an overall schematic configuration of the semiconductor device according to the first and second embodiments.

FIG. 4 is a longitudinal section view illustrating an example of an overall schematic configuration of a memory cell region in the semiconductor device 1 according to the present embodiment. As illustrated in FIG. 4, below a capacitor 128, components such as a semiconductor substrate 140, a shallow trench isolation 141, an access transistor 142, and a capacitor contact 143 included in a DRAM memory cell 145 are provided. The capacitor 128 is provided on the semiconductor substrate 140 in which components such as the shallow trench isolation 141, the access transistor 142, and the capacitor contact 143 are formed. The semiconductor substrate 140 corresponds to the semiconductor substrate 10 described later.

A bottom electrode of the capacitor 128 illustrated in FIG. 4 is electrically connected, through the capacitor contact 143, to one side of a source-drain region of the access transistor 142 formed in an active region of the semiconductor substrate 140. The bottom electrode of the capacitor 128 is connected to the semiconductor substrate 140. The gate electrode of the access transistor 142 corresponds to the word-lines 4 in FIGS. 2 and 3. The capacitor contact 143 corresponds to the capacitor contacts 6 in FIGS. 2 and 3.

As illustrated in FIG. 4, an upper layer part 154 that includes multilevel upper wiring layers containing components such as interconnects 148, 149, 150, and 151 is included above the capacitor 128. The upper layer part 154 is disposed above the memory cell 145. A top electrode of the capacitor 128 is disposed near the multilevel upper wiring layers containing components such as the interconnects 148, 149, 150, and 151. The reference signs 146, 147, and 152 illustrated in FIG. 4 denote insulating films.

The capacitor 128 and the upper layer part 154 are provided above the diagrams illustrated in FIGS. 15B to 15F and also above the diagrams illustrated in FIGS. 26B to 26F described later, similarly to the configuration illustrated in FIG. 4.

The semiconductor device 1A and a method of forming the same according to the first embodiment rill be described with reference to FIGS. 5A to 15F. FIGS. 5A to 15F are diagrams that sequentially illustrate a schematic configuration of the memory mat end region X illustrated in FIG. 1A.

Figure 5A:
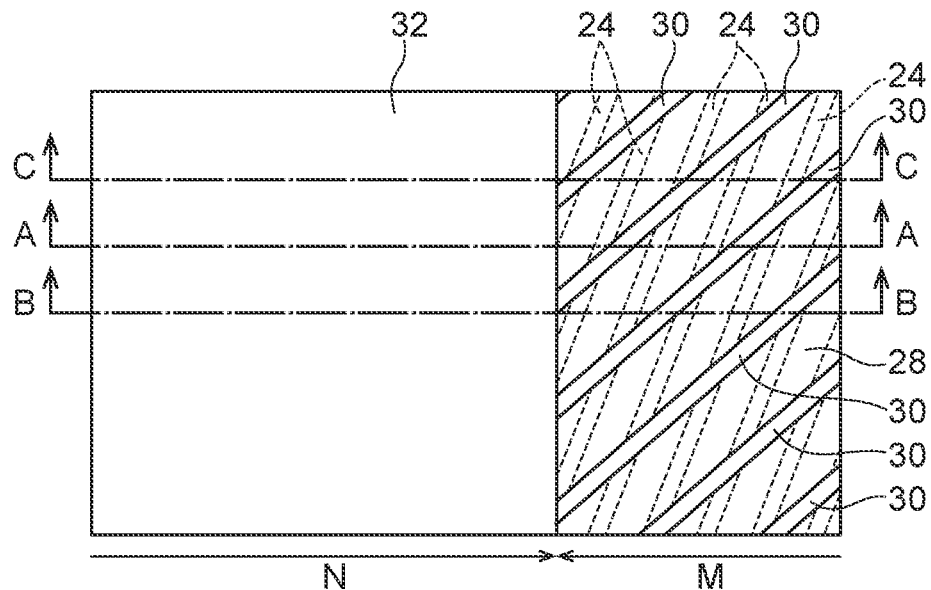
FIGS. 5A and 5B are diagrams illustrating a method of forming the semiconductor device according to the first embodiment, and illustrate an example of the schematic configuration in an exemplary process stage.
Figure 5B:
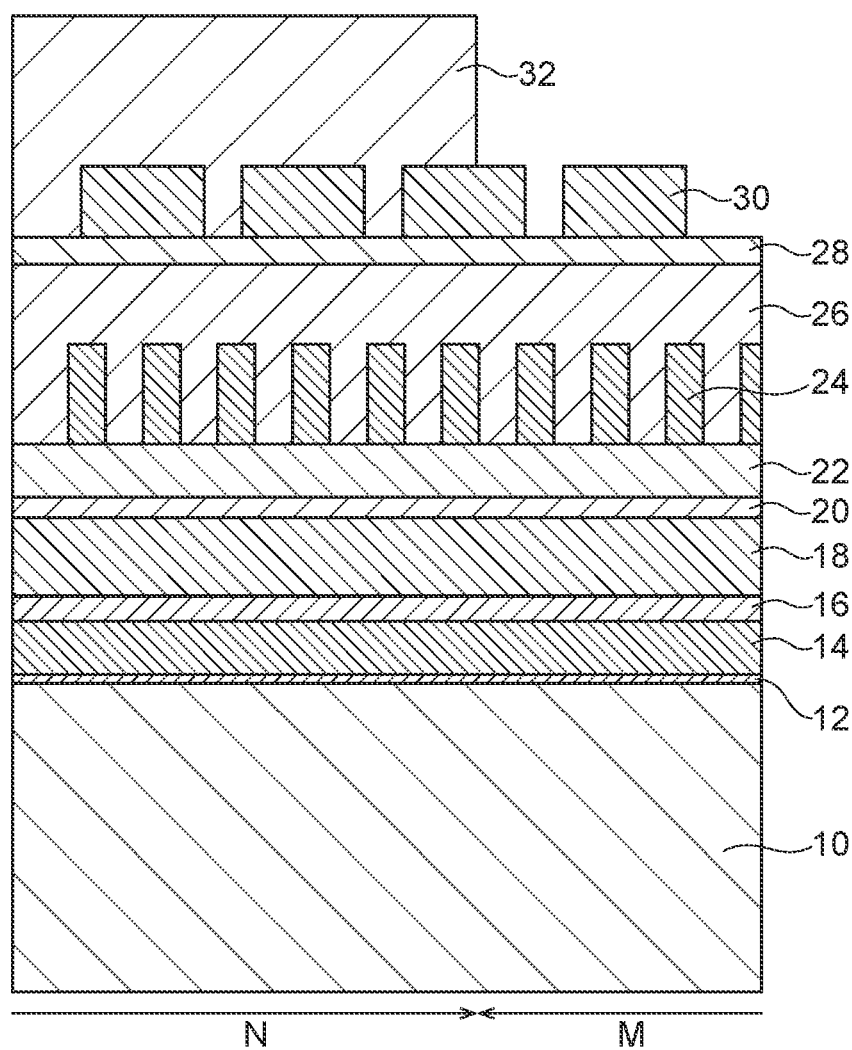

First, a method of forming the semiconductor device 1A according to the first embodiment will be described. As illustrated in FIGS. 5A and 5B, a first insulating film 12, a second insulating film 14, a third insulating film 16, a fourth insulating film 18, a fifth insulating film 20, a sixth insulating film 22, polysilicon films 24, a seventh insulating film 26, an eighth insulating film 28, ninth insulating films 30, and a resist 32 are formed on the semiconductor substrate 10.

For the semiconductor substrate 10, a monocrystalline silicon substrate can be used, for example. The first insulating film 12, the second insulating film 14, and the sixth insulating film 22 contain an insulating material such as silicon dioxide ($SiO_2$), for example. The third insulating film 16 contains an insulating material such as silicon nitride (SiN), for example. The fourth insulating film 18 and the seventh insulating film 26 contain an insulating material such as amorphous carbon (α-C), for example. The first insulating film 12, the second insulating film 14, the third insulating film 16, the fourth insulating film 18, the sixth insulating film 22, and the seventh insulating film 26 are formed by chemical vapor deposition (hereinafter referred to as CVD), for example.

The fifth insulating film 20 and the eighth insulating film 28 contain a dielectric anti-reflective coating (DARC) such as a silicon oxynitride film (SiON film), for example. The fifth insulating film 20 and the eighth insulating film 28 are formed by a thermal CVD process, a plasma CVD process, or the like that heats a substrate such as a silicon wafer while also supplying a film-forming gas onto the substrate. The film-forming gas contains silane gas as a source of silicon (Si) and nitrous oxide ($N_2O$) gas as a source of nitrogen and oxygen, for example.

A plurality of polysilicon films 24 are formed by using CVD to form polysilicon (Poly-Si) on the sixth insulating film 22, and then patterned using known lithography technology and anisotropic dry etching technology. Each of the plurality of polysilicon films 24 is patterned in a line-and-space arrangement with the same dimensions and the same repeating pitch. Furthermore, the polysilicon films 24 can also be formed by using a known multi-patterning technology such as double patterning or quad patterning process. If a multi-patterning technology such as double patterning or quad patterning process is used, polysilicon films 24 having a repeating pitch that is ½ or ¼ the size limit of lithographic exposure can be formed.

The ninth insulating films 30 contains an insulating material such as silicon dioxide ($SiO_2$), for example. The ninth insulating films 30 are formed by CVD and then patterned using known lithography technology and anisotropic dry etching technology. The ninth insulating films 30 are patterned in a line-and-space arrangement with the same dimensions and the same repeating pitch. The polysilicon films 24 and the ninth insulating films 30 are arranged so as to intersect at a predetermined angle.

The resist 32 is patterned by using known lithography technology. The resist 32 is patterned so as to cover the peripheral region N and leave the memory cell region M open.

Figure 6A:
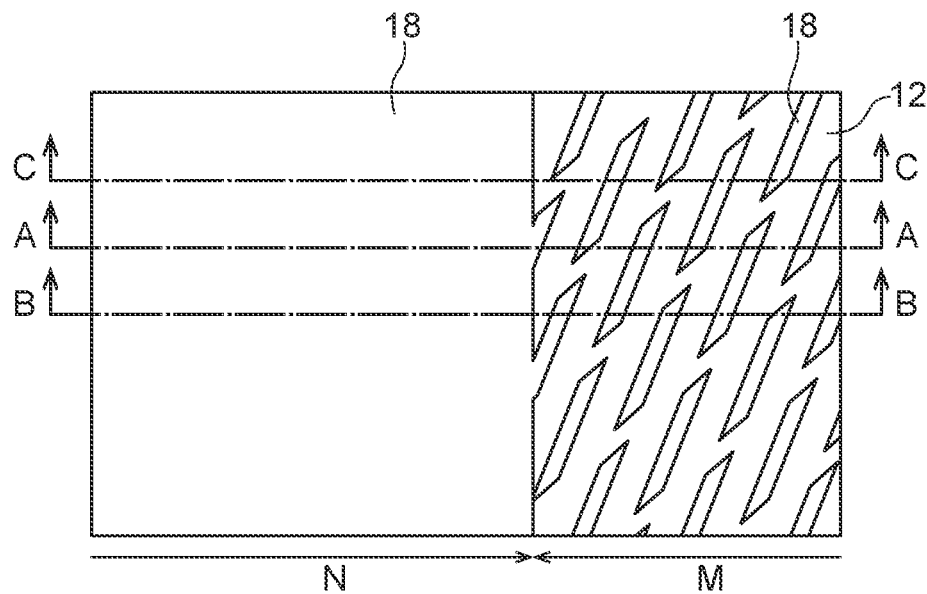
FIGS. 6A and 6B are diagrams illustrating a method of forming the semiconductor device according to the first embodiment, and illustrate an example of the schematic configuration in an exemplary process stage following the process stage illustrated in FIGS. 5A and 5B.
Figure 6B:
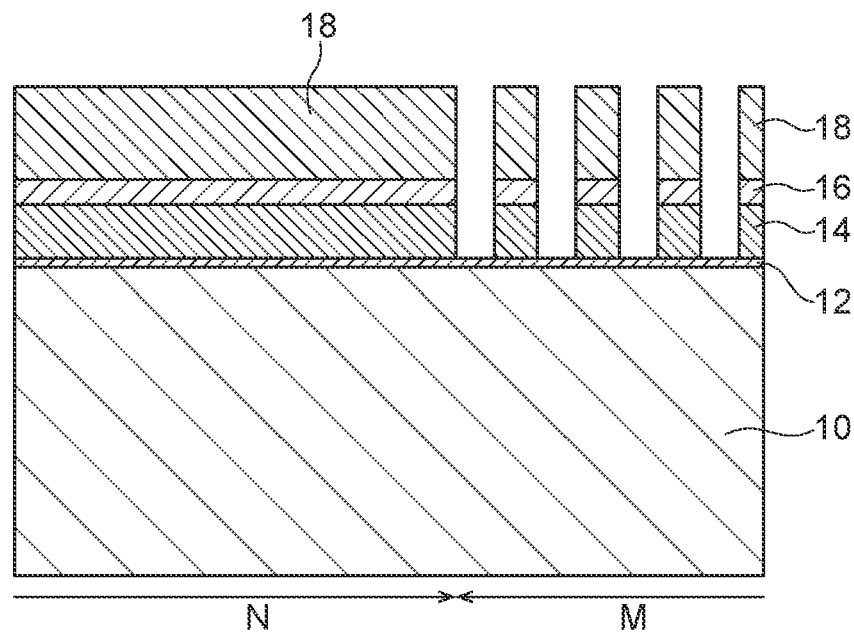

Next, as illustrated in FIGS. 6A and 6B, anisotropic dry etching is performed to etch the eighth insulating film 28 and the seventh insulating film 26 using the resist 32 and the ninth insulating film 30 as a mask. This etching is performed under conditions by which the etch rate of the silicon oxynitride film contained in the eighth insulating film 28 and the amorphous carbon contained in the seventh insulating film 26 is high, and the etch rate of the silicon dioxide contained in the ninth insulating films 30 and the polysilicon contained in the polysilicon films 24 is extremely low.

Next, anisotropic dry etching is performed to successively etch the silicon dioxide contained in the sixth insulating film 22, the silicon oxynitride film contained in the fifth insulating film 20, the amorphous carbon contained in the fourth insulating film 18, the silicon nitride contained in the third insulating film 16, and the silicon dioxide contained in the second insulating film 14.

By his etching, anisotropic dry etching is performed on the memory cell region M using the superimposed pattern of the ninth insulating films 30 and the polysilicon films 24 as a mask. The etching causes the superimposed pattern of the resist 32, the ninth insulating films 30, and the polysilicon films 24 to be transferred onto the sixth insulating film 22, the fifth insulating film 20, the fourth insulating film 18, the third insulating film 16, and the second insulating film 14 in the memory cell region M. Thereafter, the polysilicon films 24, the sixth insulating film 22, and the fifth insulating film 20 are removed.

Figure 7A:
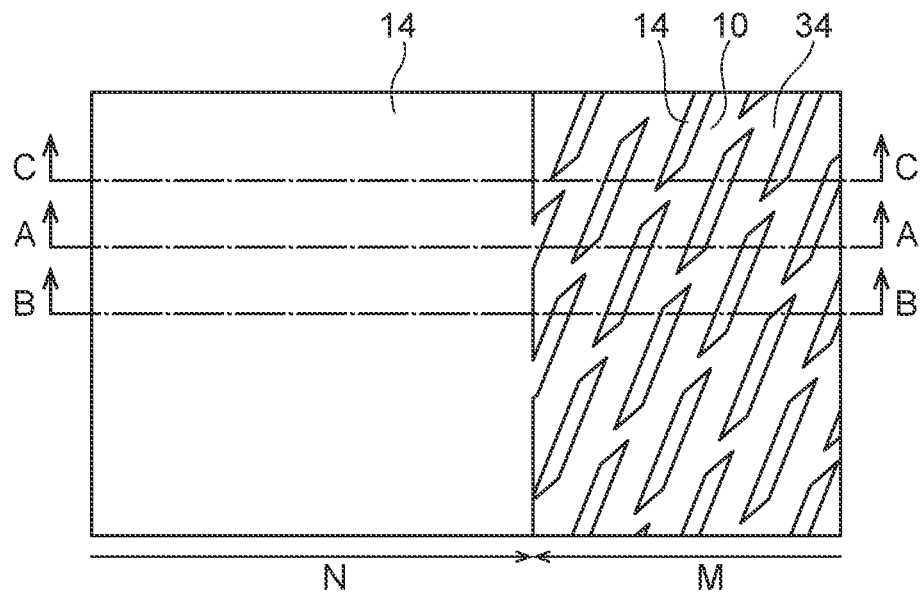
FIGS. 7A and 7B are diagrams illustrating a method of forming the semiconductor device according to the first embodiment, and illustrate an example of the schematic configuration in an exemplary process stage following the process stage illustrated in FIGS. 6A and 6B.
Figure 7B:
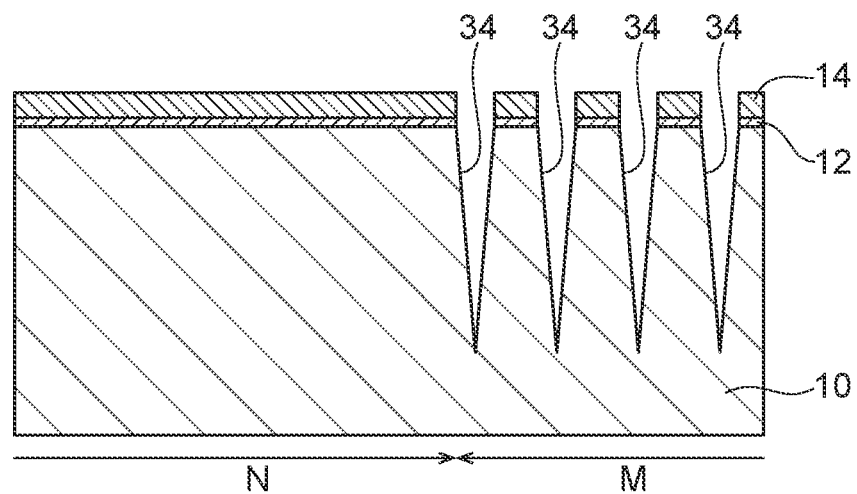

Next, as illustrated in FIGS. 7A and 7B, anisotropic dry etching is performed using the fourth insulating film 18, the third insulating film 16, and the second insulating film 14 as a mask to form trenches 34 in the semiconductor substrate 10. During the etching, the fourth insulating film 18, the third insulating film 16, and a portion of the second insulating film 14 are removed, leaving a portion of the first insulating film 12 and a portion of the second insulating film 14 on the semiconductor substrate 10.

Figure 8A:
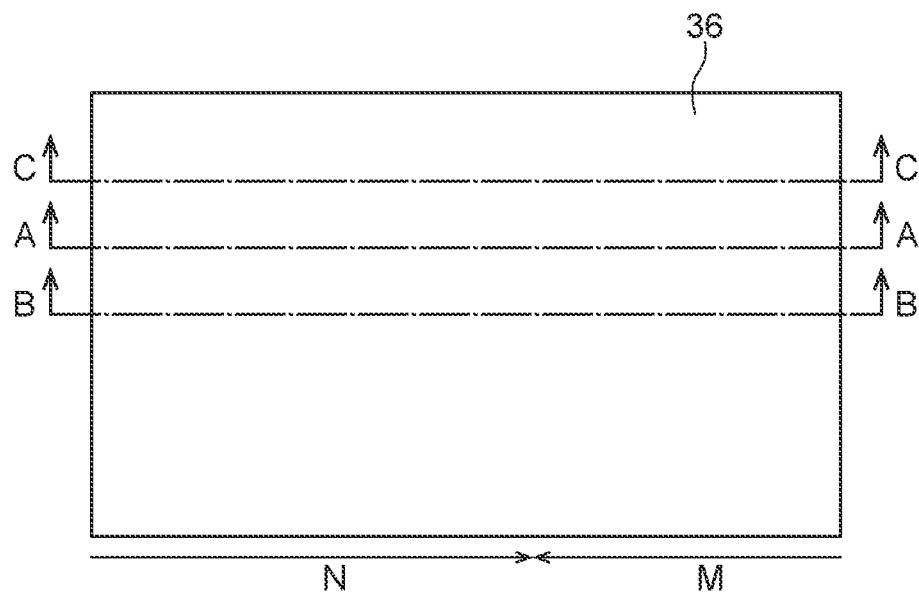
FIGS. 8A and 8B are diagrams illustrating a method of forming the semiconductor device according to the first embodiment, and illustrate an example of the schematic configuration in an exemplary process stage following the process stage illustrated in FIGS. 7A and 7B.
Figure 8B:
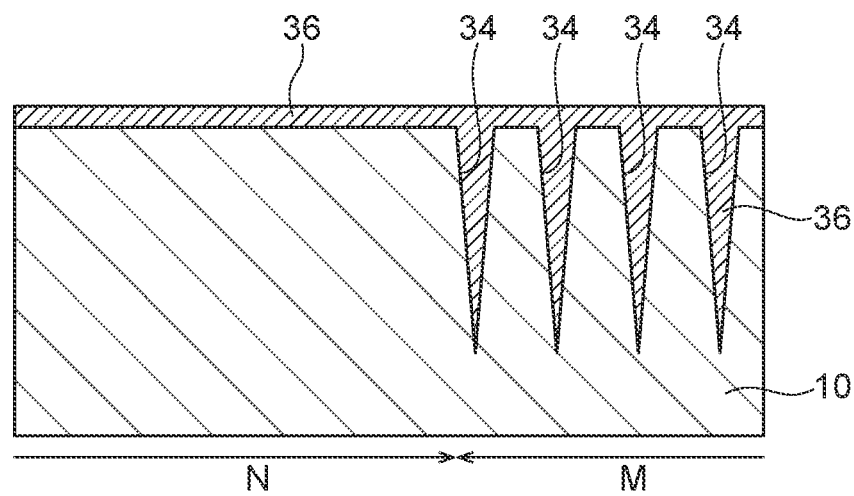

Next, as illustrated in FIGS. 8A and 8B, the second insulating film 14 and the first insulating film 12 are removed and then the trenches 34 are filled to form a 10th insulating film 36 so as to cover the top face of the semiconductor substrate 10. The 10th insulating film 36 contains an insulating material such as silicon dioxide ($SiO_2$), for example. The 10th insulating film 36 is formed using CVD, for example.

Figure 9A:
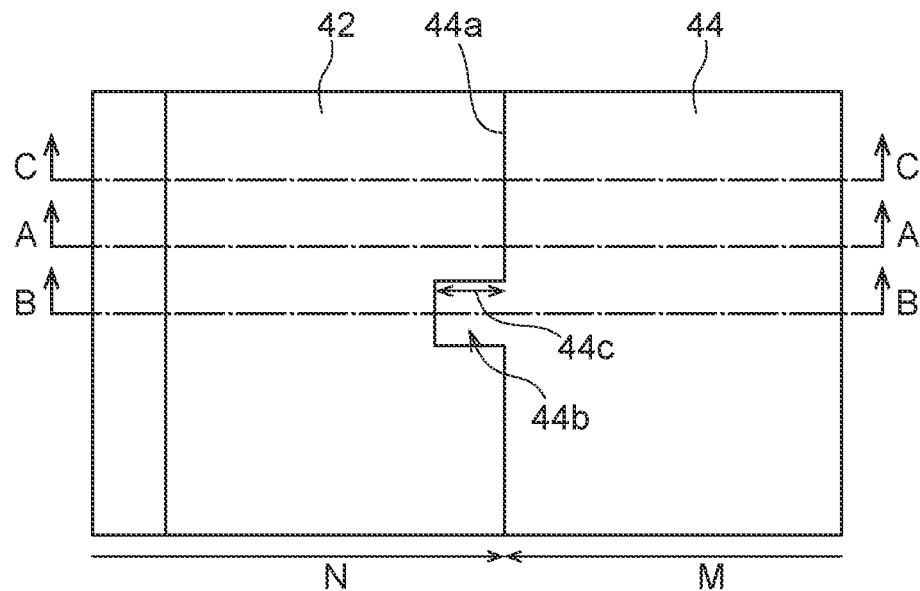
FIGS. 9A to 9C are diagrams illustrating a method of forming the semiconductor device according to the first embodiment, and illustrate an example of the schematic configuration in an exemplary process stage following the process stage illustrated in FIGS. 5A and 8B.
Figure 9B:
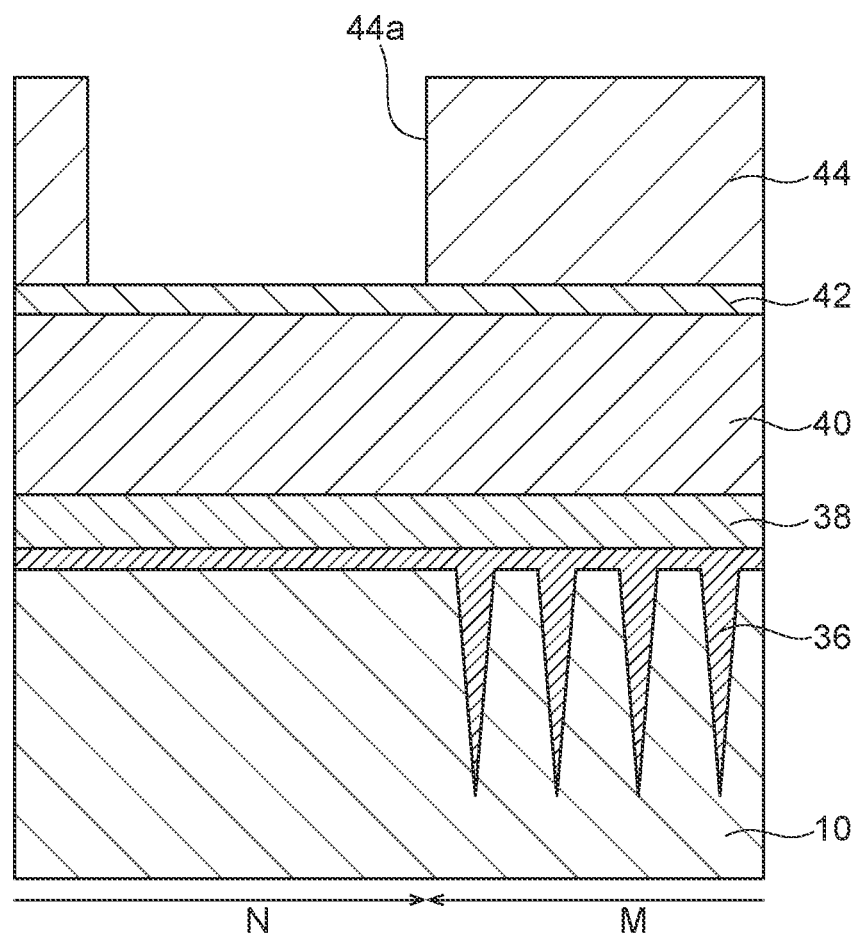
Figure 9C:
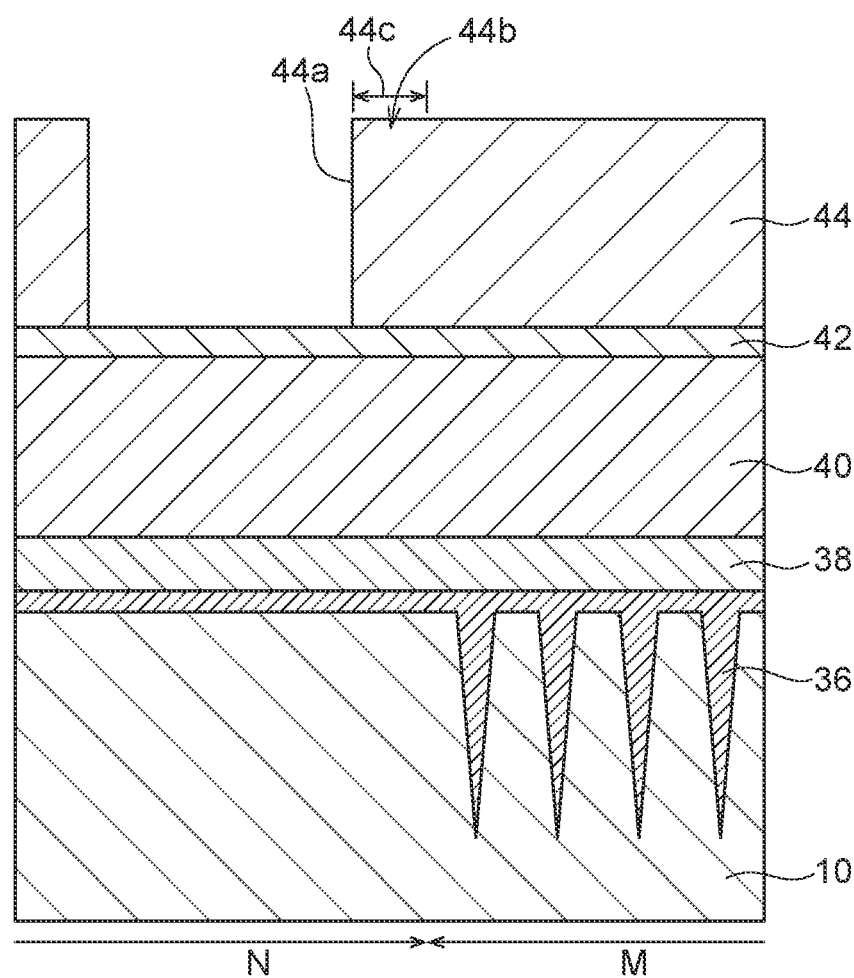

Next, as illustrated in FIGS. 9A, 9B, and 9C, an 11th insulating film 38, a 12th insulating film 40, a 13th insulating film 42, and a resist 44 are formed on top of the semiconductor substrate 10 on which the 10th insulating film 36 is formed.

As illustrated in FIGS. 9A, 9B, and 9C, an opening 44*a* is formed in the resist 44. Also, as illustrated in FIGS. 9A and 9C, a projection 44*b* that projects toward the peripheral region N from the perspective of the memory cell region M is formed. The projection 44*b* has a projection length 44*c* extending from the edge of the memory cell region M.

Figure 10A:
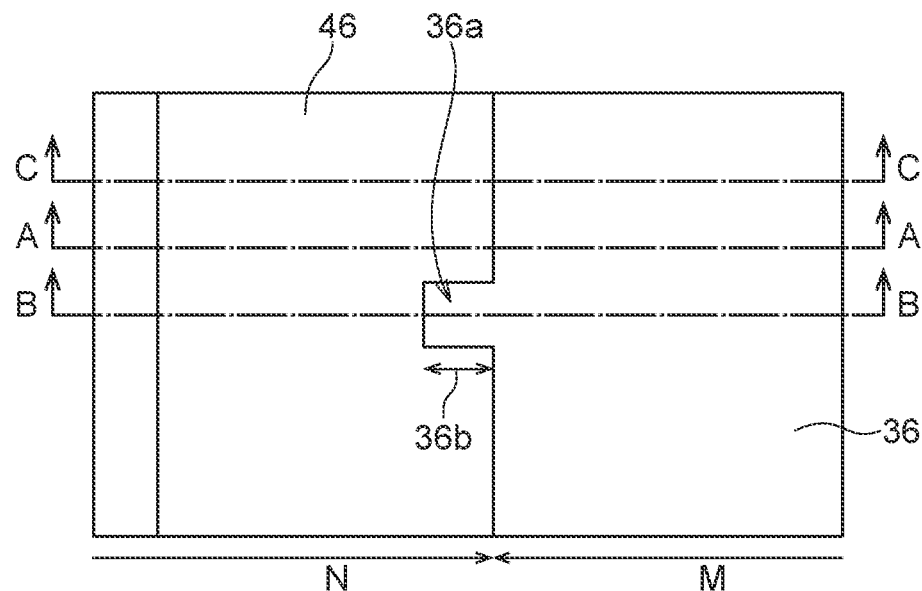
FIGS. 10A to 10C are diagrams illustrating a method of forming the semiconductor device according to the first embodiment, and illustrate an example of the schematic configuration in an exemplary process stage following the process stage illustrated in FIGS. 9A, 9B, and 9C.
Figure 10B:
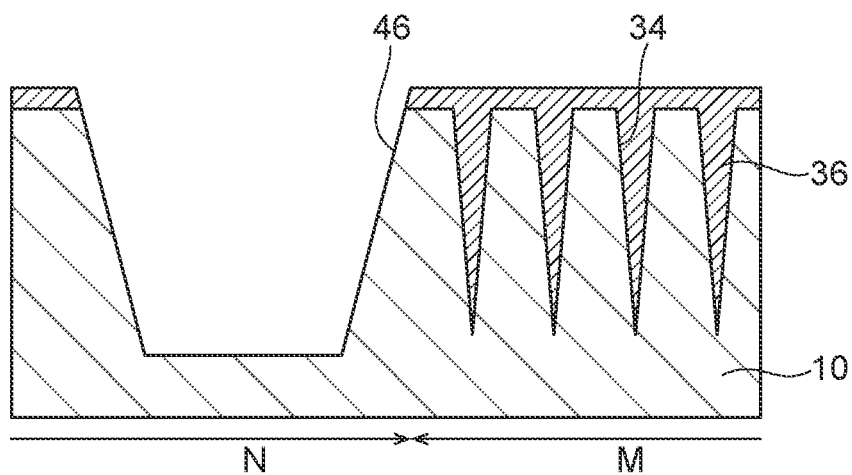
Figure 10C:
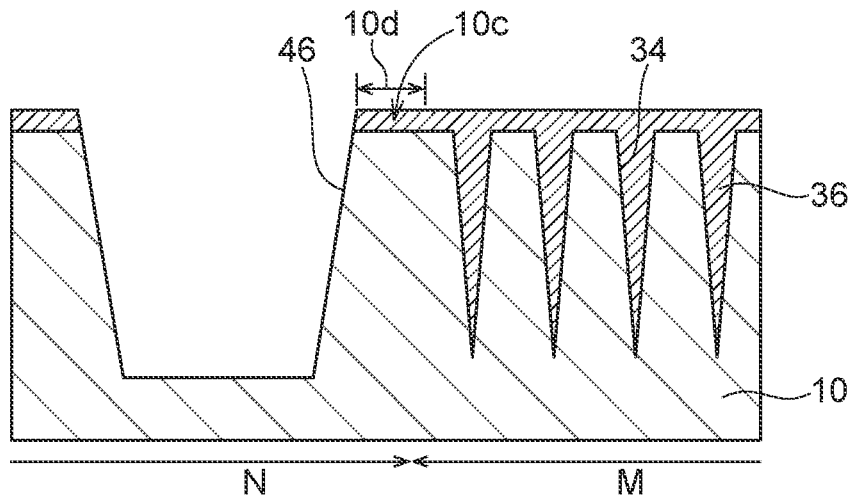

Next, as illustrated in FIGS. 10A, 10B, and 10C, anisotropic dry etching is performed on the 13th insulating film 42, the 12th insulating film 40, the 11th insulating film 38, the 10th insulating film 36, and the semiconductor substrate 10 using the resist 44 as a mask. With this arrangement, a peripheral trench 46 is formed in the semiconductor substrate 10. Thereafter, the resist 44, the 13th insulating film 42, the 12th insulating film 40, and the 11th insulating film 38 are removed.

The peripheral trench 46 is formed in the peripheral region N. The pattern formed by the resist 44 having the projection 44*b* illustrated in FIG. 9A and the like is transferred to the semiconductor substrate 10, and a projection 10*c* having a projection length 10*d* from the edge of the memory cell region M is formed. In the projection 10*c*, the active regions 10*a* are lengthened by an amount equal to the projection length 10*d*.

Figure 11A:
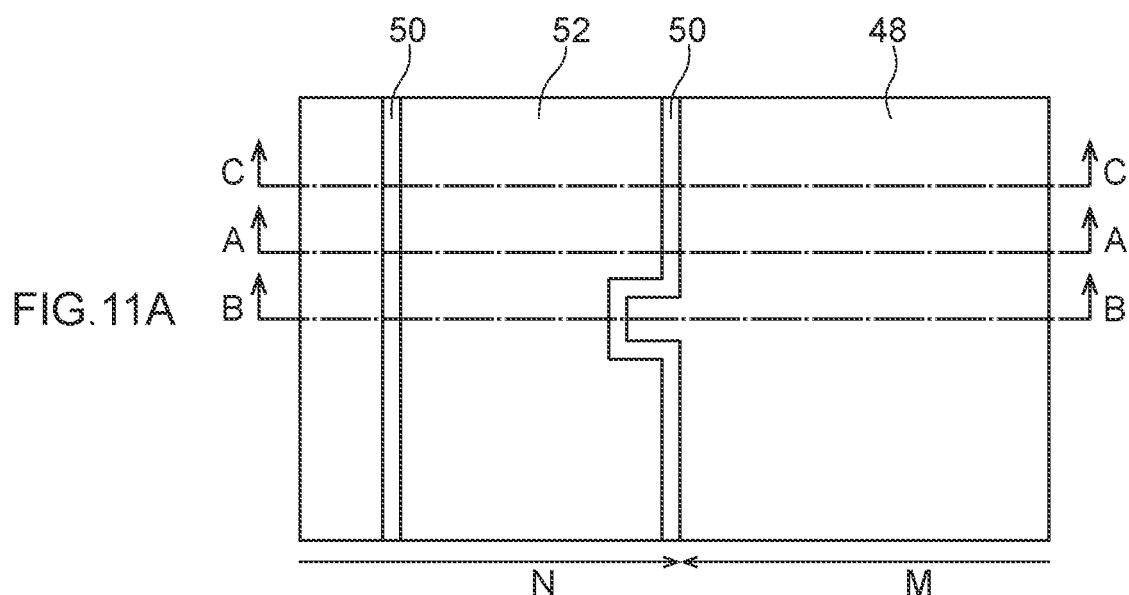
FIGS. 11A to 11C are diagrams illustrating a method of thrilling the semiconductor device according to the first embodiment, and illustrate an example of the schematic configuration in an exemplary process stage following the process stage illustrated in FIGS. 10A to 10C.
Figure 11B:
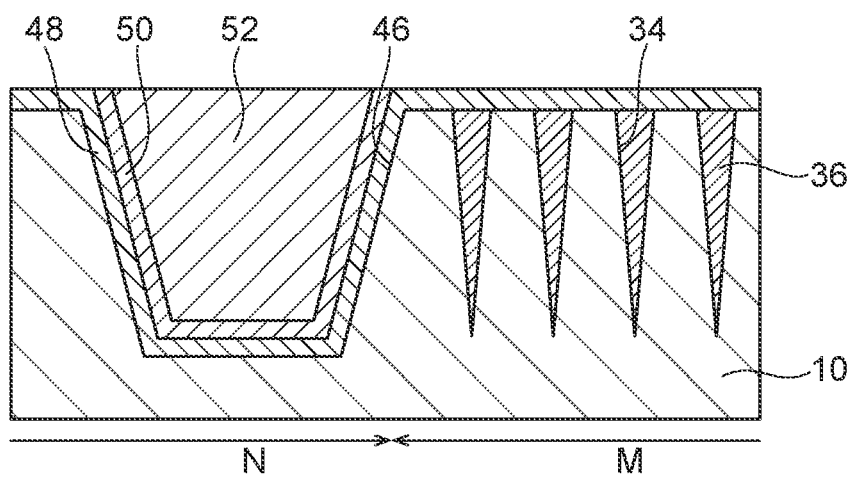
Figure 11C:
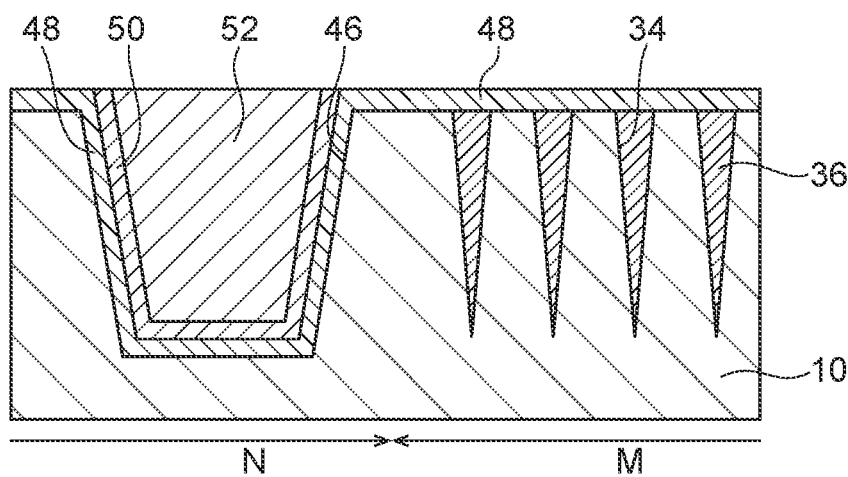

Next, as illustrated in FIGS. 11A to 11C, a 14th insulating film 48 is formed on the surface of the semiconductor substrate 10 and on the inner surface of the peripheral trench 46. Next, the 14th insulating film 48, a 15th insulating film 50, and a 16th insulating film 52 are formed thick enough to fill the peripheral trench 46, and subsequently, an etchback is performed by anisotropic dry etching to fill the peripheral trench 46 with the 14th insulating film 48, the 15th insulating film 50, and the 16th insulating film 52.

The 14th insulating film 48 and the 16th insulating film 52 contain an insulating material such as silicon dioxide, for example. The 15th insulating film 50 contains an insulating material such as silicon nitride, for example. The 14th insulating film 48, the 15th insulating film 50, and the 16th insulating film 52 are formed by CVD, for example. The 14th insulating film 48 may also be formed by thermal oxidation of the silicon contained in the semiconductor substrate 10 instead of by CVD.

Next, as illustrated in FIGS. 12A to 12E, a 17th insulating film 54, an 18th insulating film 56, a 19th insulating film 58, a hard mask 59, and a resist 60 patterned by known lithography technology are formed on top of the semiconductor substrate 10 on which the 14th insulating film 48, the 15th insulating film 50, and the 16th insulating film 52 are formed.

The 17th insulating film 54, the 18th insulating film 56, the 19th insulating film 58, and the hard mask 59 contain an insulating material. The 17th insulating film 54 contains amorphous carbon, for example. The 18th insulating film 56 contains a dielectric anti-reflective coating (DARC) such as silicon oxynitride (SiON), for example. The 19th insulating film 58 and the hard mask 59 contain silicon dioxide. The 17th insulating film 54, the 18th insulating film 56, the 19th insulating film 58, and the hard mask 59 are formed by CVD. The hard mask 59 is patterned in a line-and-space arrangement with the same dimensions and the same repeating pitch.

Figure 12A:
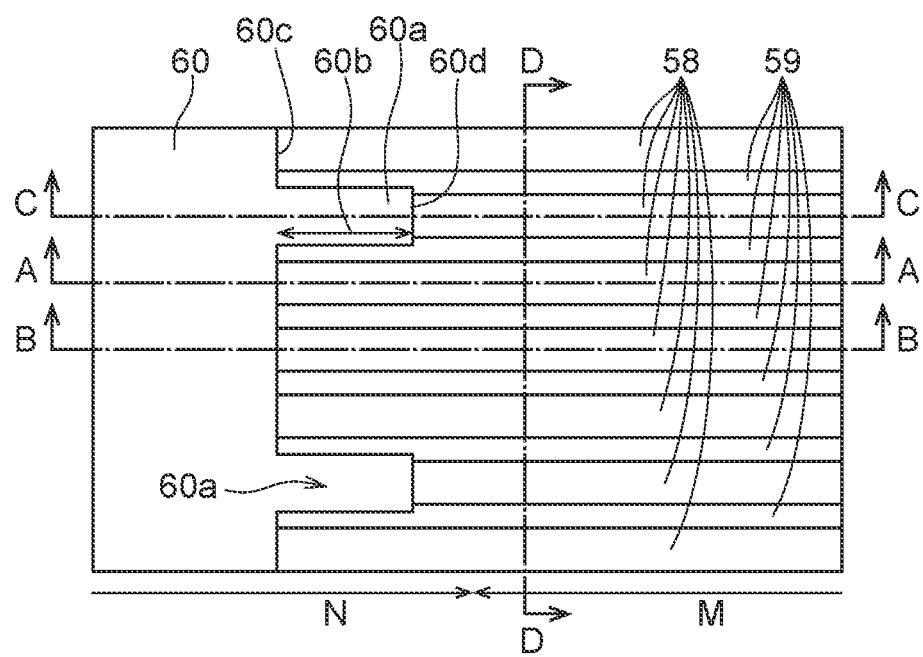
FIGS. 12A to 12E are diagrams illustrating a method of firming the semiconductor device according to the first embodiment, and illustrate an example of the schematic configuration in an exemplary process stage following FIGS. 11A to 11C.
Figure 12B:
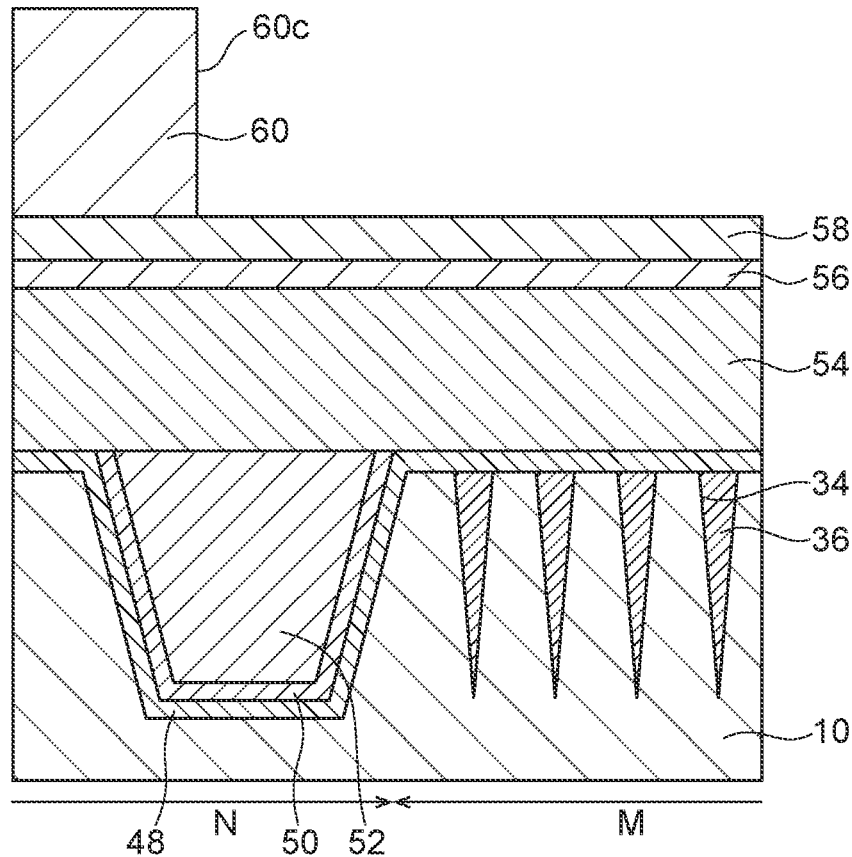
Figure 12C:
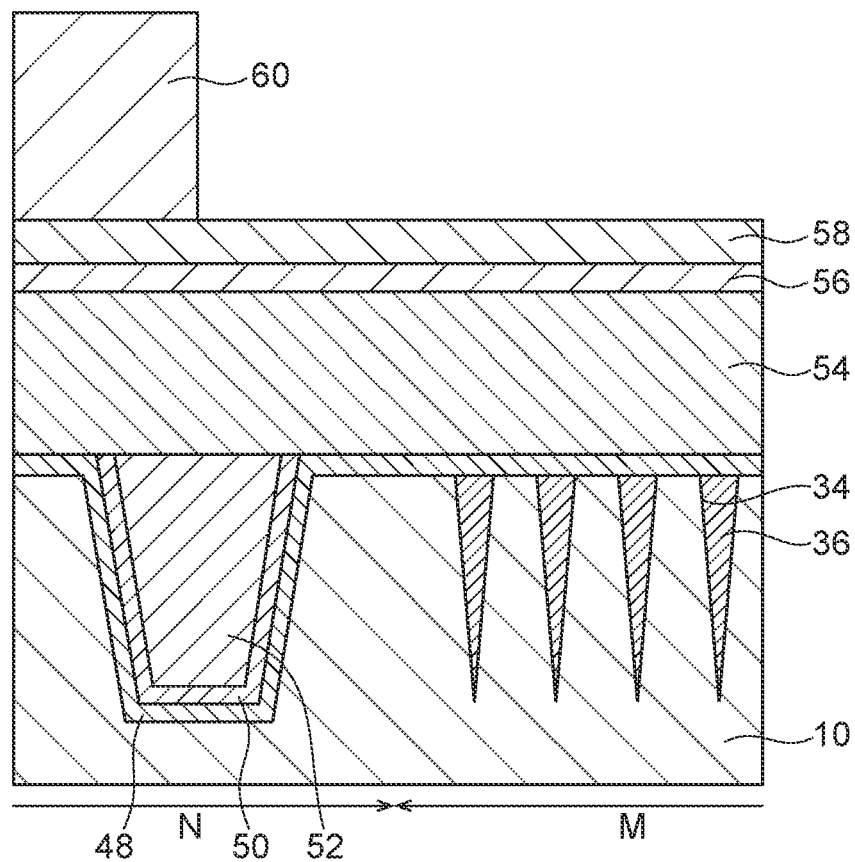
Figure 12D:
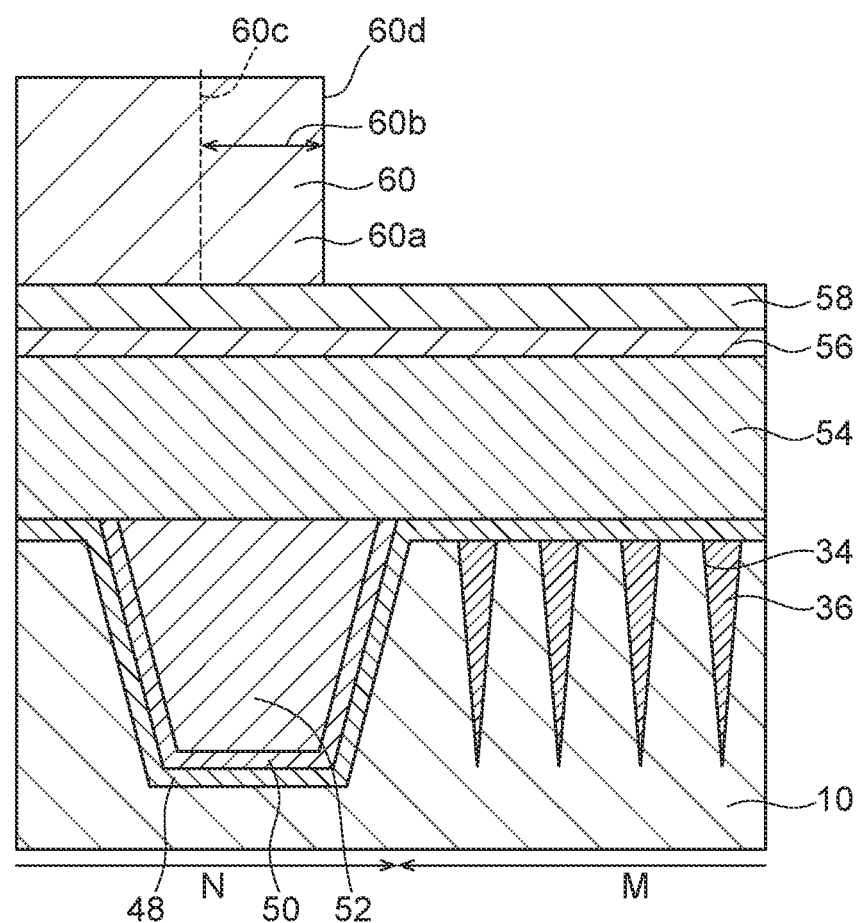
Figure 12E:
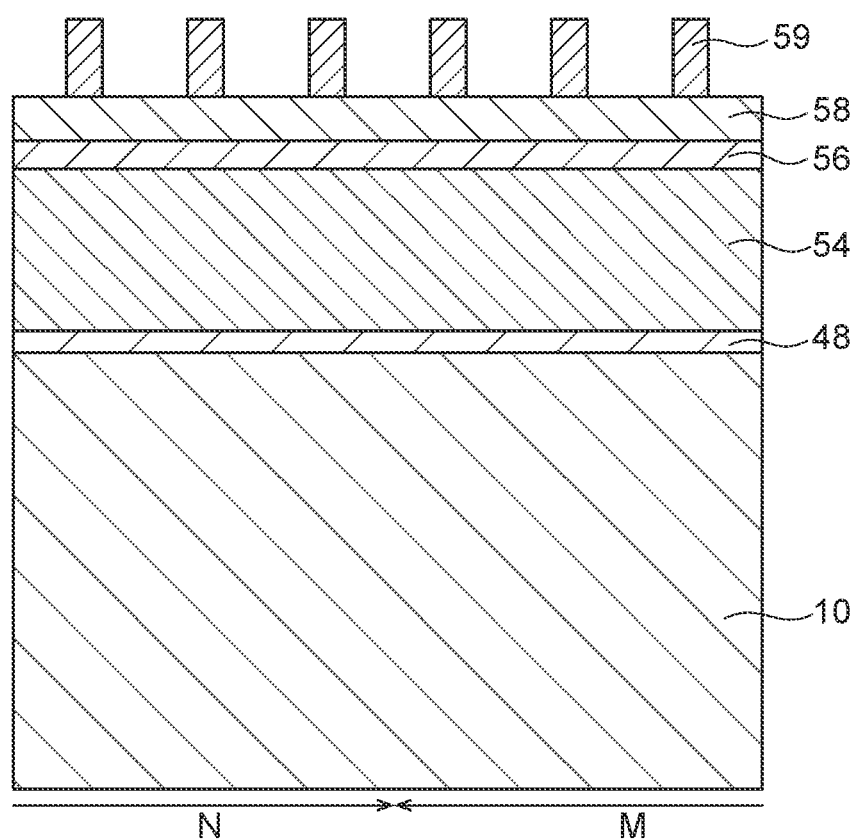

Also, as illustrated in FIGS. 12A and 12E, the hard mask 59 can also be formed by using a known multi-patterning technology such as double patterning or quad patterning process. If a multi-patterning technology such as double patterning or quad patterning process is used, a hard mask 59 having a repeating pitch that is ½ or ¼ the size limit of lithographic exposure can be formed.

As illustrated in FIGS. 12A and 12D, the resist 60 has a projection 60a that projects toward the memory cell region M from an edge position 60c of the resist 60. The projection 60a projects toward the memory cell region M from the edge position 60c by a projection length 60b. The edge position 60c of the resist 60 and a projection end 60d of the projection 60a are both positioned inside the peripheral region N.

Next, as illustrated in FIGS. 13A to 13D, anisotropic dry etching is performed using the resist 60 and the hard mask 59 as a mask.

Due to the anisotropic dry etching, the portions of the 17th insulating film 54, the 18th insulating film 56, and the 19th insulating film 58 not covered by the resist 60 having the projection 60a and also the hard mask 59 are etched. Furthermore, a straight trench 62 is formed in the region not covered by the resist 60 and the hard mask 59. A conductive material is buried in the trench 62 in a later step, and the buried conductive material functions as the DRAM word-line 4 (e.g., the word-line 4 is embedded in the trench 62). Next, the resist 60, and, the 17th insulating film 54, the 18th insulating film 56, the 19th insulating film 58, and the 14th insulating film 48 on the top face of the semiconductor substrate 10 in the regions are removed.

Figure 13A:
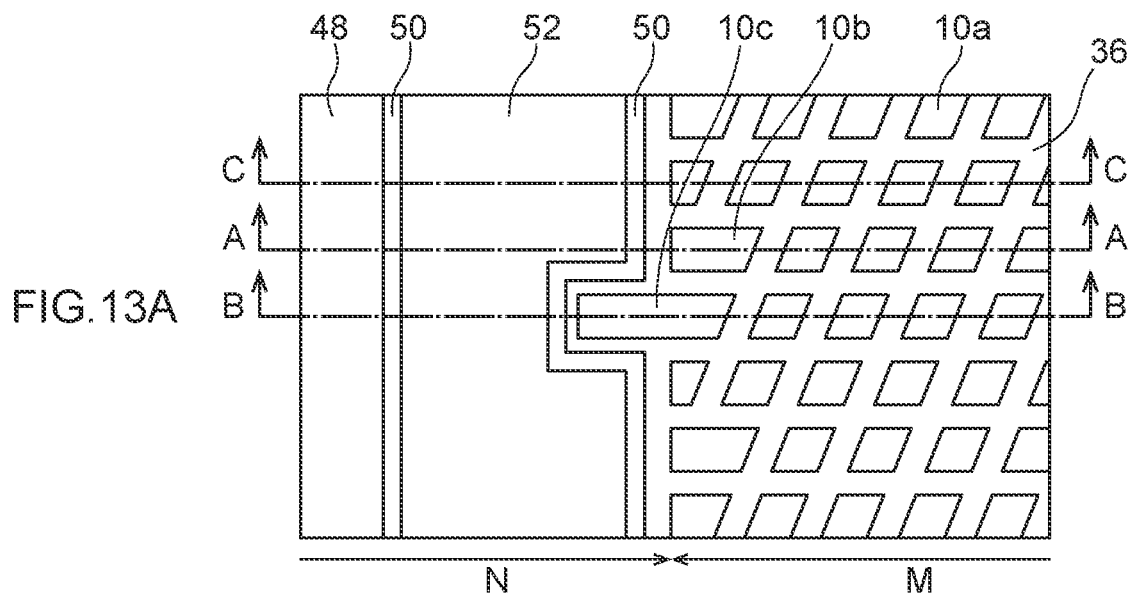
FIGS. 13A to 13D are diagrams illustrating a method of forming the semiconductor device according to the first embodiment, and illustrate an example of the schematic configuration in an exemplary process stage following the process stage illustrated in FIGS. 12A to 12E.
Figure 13B:
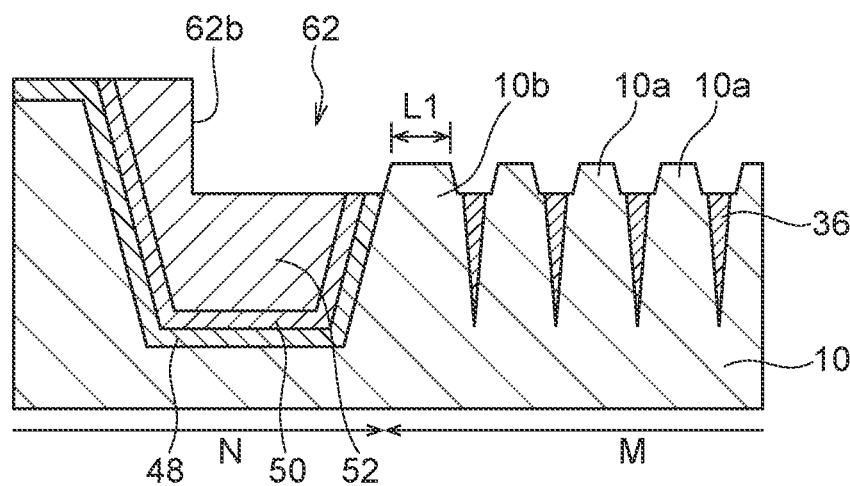
Figure 13C:
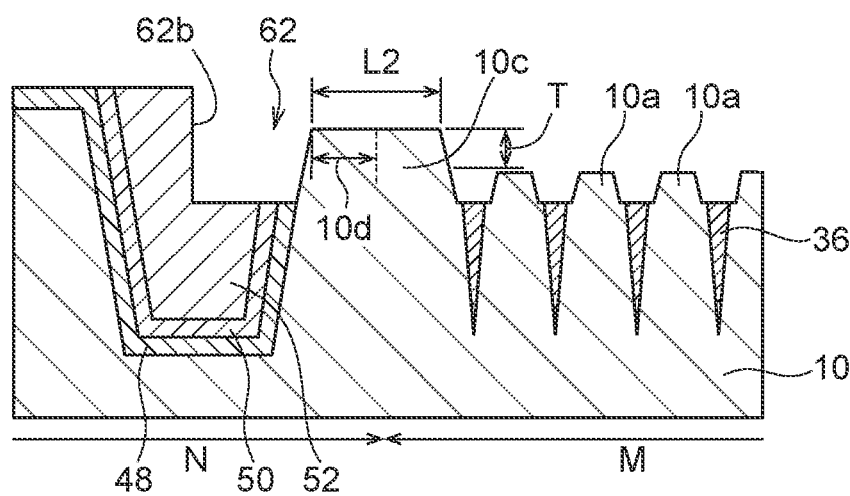
Figure 13D:
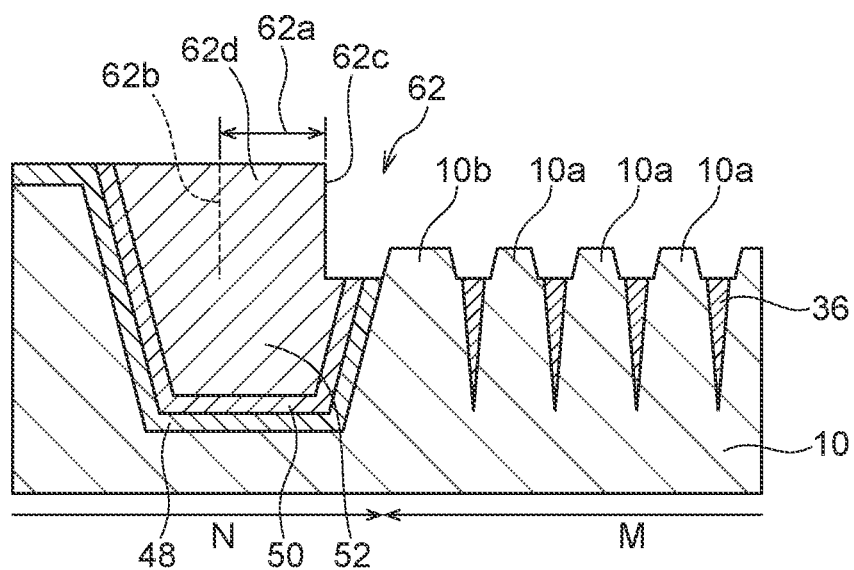

As illustrated in FIGS. 13B to 13D, the trench 62 having the shape of the resist 60 and the hard mask 59 transferred thereto is formed in the memory cell region M and the peripheral region N by dry etching. Also, as illustrated in FIG. 13C, the projection 10c projects out farther than an edge 10b by a projection length 10d at a position along the line B-B. Consequently, the length L2 of the projection 10c is longer than the length L1 of edge 10b illustrated in FIG. 13B.

In other words, because the projection 10c is long, the projection 10c does not retreat due to the above dry etching. Consequently, the top face of the projection 10c is formed at a position higher than the top face of the active regions 10a by a height difference T, and the projection 10c projects upward. The height difference T depends on the length L2 of the projection 10c. An optimal value for the length L2 of the projection 10c that is sufficient to obtain the necessary height difference T can be found by using a test element group (TEG) chip for testing in which projections 10c having various lengths L2 are formed, for example.

Also, as illustrated in FIG. 13D, in the portion along the line C-C in FIG. 13A, the projection 60a of the resist 60 illustrated in FIG. 12A is transferred and patterned. As illustrated in FIGS. 13A and 13D, an edge position 62c of the 15th insulating film 50 projects toward the memory cell region M by a projection length 62a farther than an edge position 62b in other portions, or in other words the portions along the line A-A or B-B in FIG. 13A. With this arrangement, a projection 62d is formed. The trench 62 is not formed in the region where the projection 62d is provided. Consequently, the word-link 4 is not formed in a later step in the portions where the projection 62d is provided.

Next, as illustrated in FIGS. 14A to 14E, a conductive part 64 is buried in the trench 62, and furthermore, known lithography technology and anisotropic dry etching not illustrated are performed to form a step 64a in the conductive part 64 in the memory cell region M.

The conductive part 64 contains a conductive material such as titanium nitride (TiN), for example. For example, the conductive part 64 is formed by depositing titanium nitride by CVD and then performing an etchback by anisotropic dry etching to leave the titanium nitride inside the trench 62.

Figure 14A:
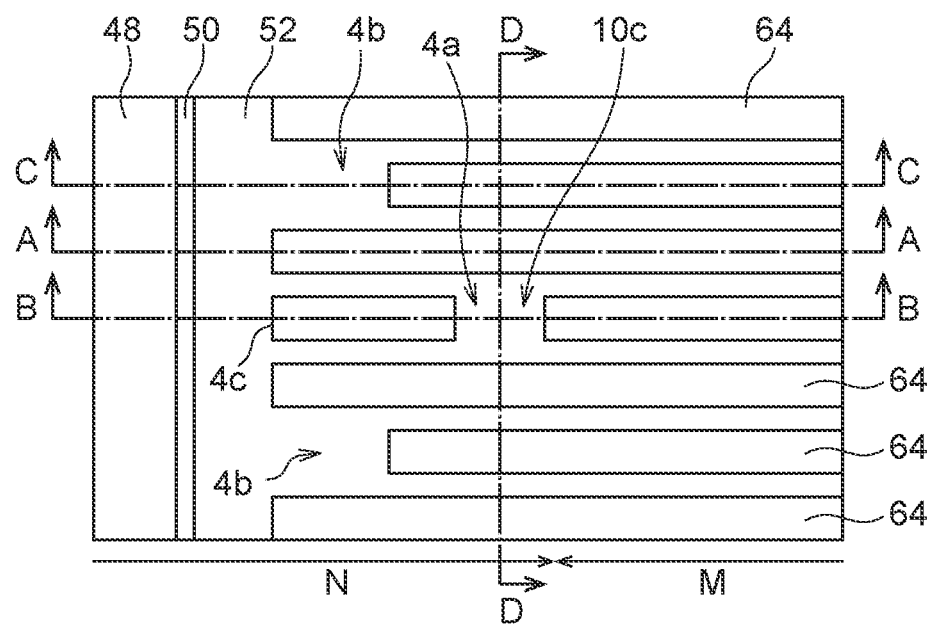
FIGS. 14A to 14E are diagrams illustrating a method of forming the semiconductor device according to the first embodiment, and illustrate an example of the schematic configuration in an exemplary process stage following the process stage illustrated in FIGS. 13A to 13D.
Figure 14B:
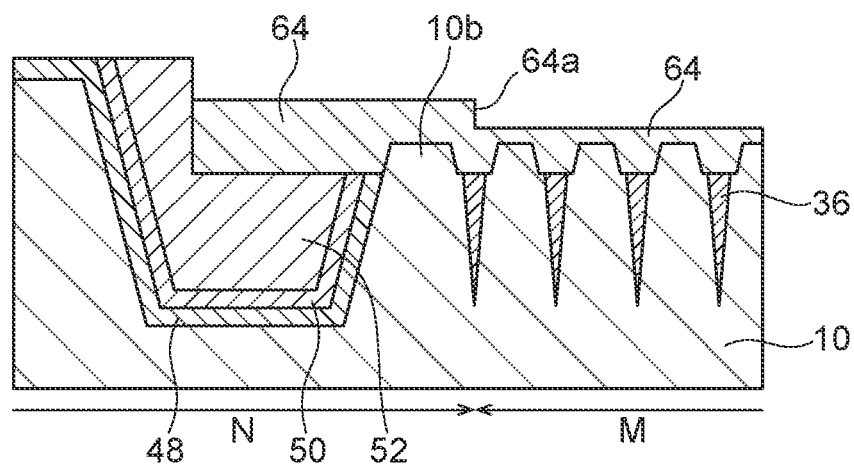
Figure 14C:
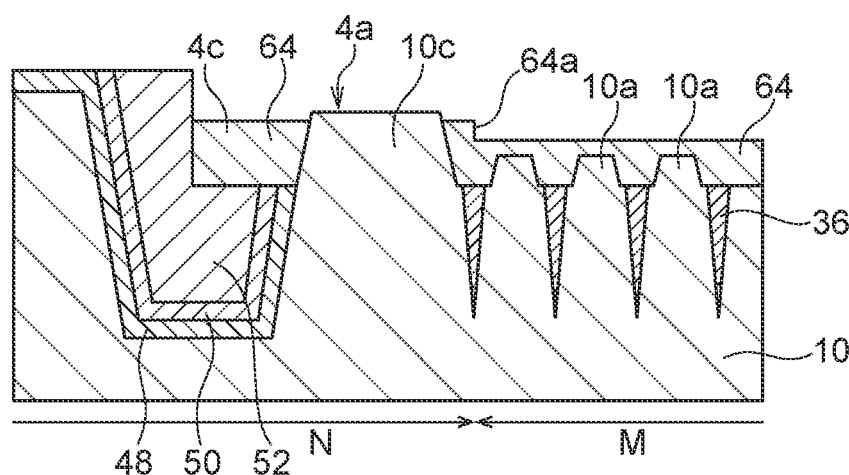

Here, as illustrated in FIG. 14C, in the portion along the line B-B, the projection 10c whose top face projects out higher than the active regions 10a is formed. The etchback by anisotropic dry etching for forming the conductive part 64 is performed until the polysilicon on the top face of the projection 10c is removed and the top face of the projection 10c is exposed. With this arrangement, the conductive part 64 is not formed on top of the projection 10c, thereby causing the conductive part 64 to be divided. With this arrangement, the top of the projection 10c acts as a first portion 4a where the conductive part 64 is not formed.

Figure 14D:
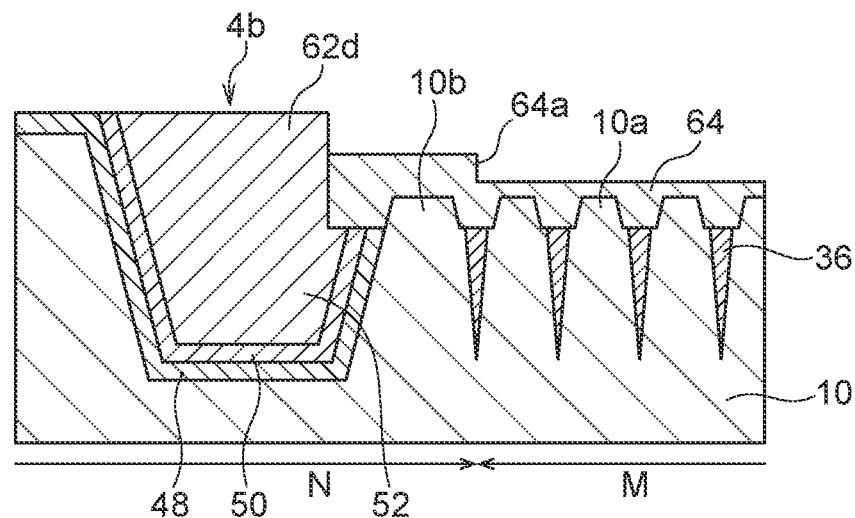
Figure 14E:
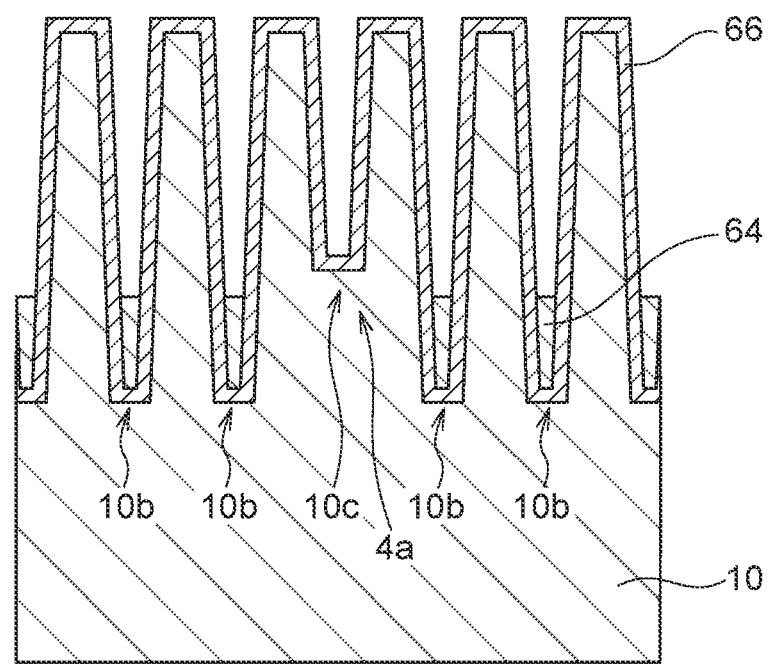

Also, in the portion along the line C-C, as illustrated in FIG. 14D, the projection 62d where the 16th insulating film 52 projects toward the memory cell region M is included. Because the trench 62 is not formed in this portion, the projection 62d acts as the second portion 4b where the conductive part 64 is not formed.

Next, as illustrated in FIGS. 15A to 15F, the step 64a is filled with polysilicon 68, and subsequently, a 20th insulating film 70 is formed on top of the semiconductor substrate 10 so as to cover the 14th insulating film 48, the 16th insulating film 52, the conductive part 64, the polysilicon 68, and the like formed on the semiconductor substrate 10.

The polysilicon 68 is formed by depositing polysilicon by CVD for example, and then performing an etchback by anisotropic dry etching to fill the step 64a. The 20th insulating film 70 contains an insulating material such as silicon dioxide, for example. The 20th insulating film 70 is formed by CVD, for example.

Thereafter, contact holes that reaches each conductive part 64 are formed from the top face of the 20th insulating film 70, and the contact holes are filled with a conductive material to thereby form the word-line contacts 8. The word-line contacts 8 contain a conductive material such as tungsten, for example. The wordline contacts 8 are formed by depositing a conductive material such as tungsten by CVD so as to fill the contact holes for example, and then performing an etchback by anisotropic dry etching. Through the above steps, the semiconductor device 1A according to the first embodiment is formed.

Figure 15A:
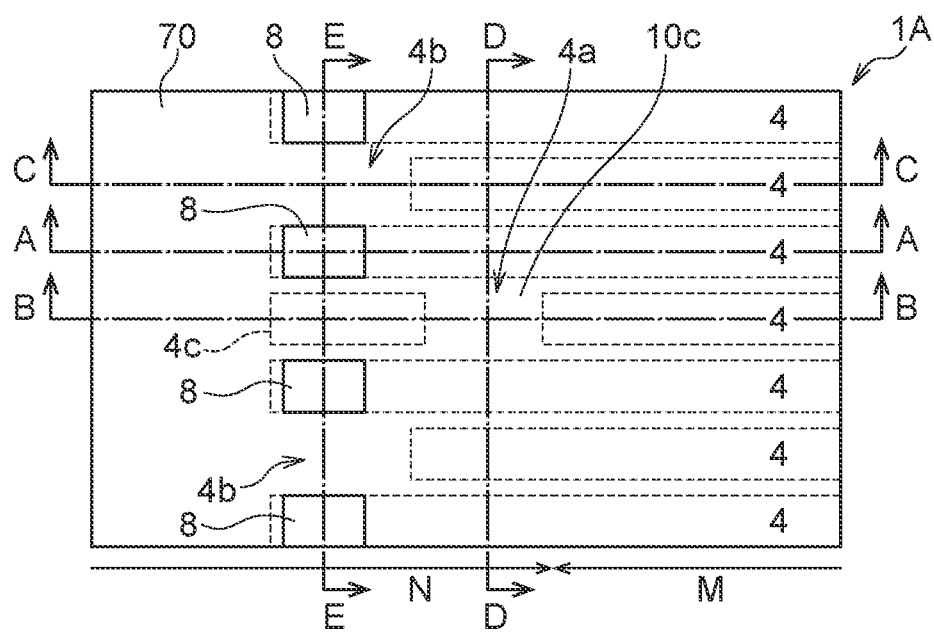
FIGS. 15A to 15F are diagrams illustrating the semiconductor device according to the first embodiment and a method of forming the same.
Figure 15B:
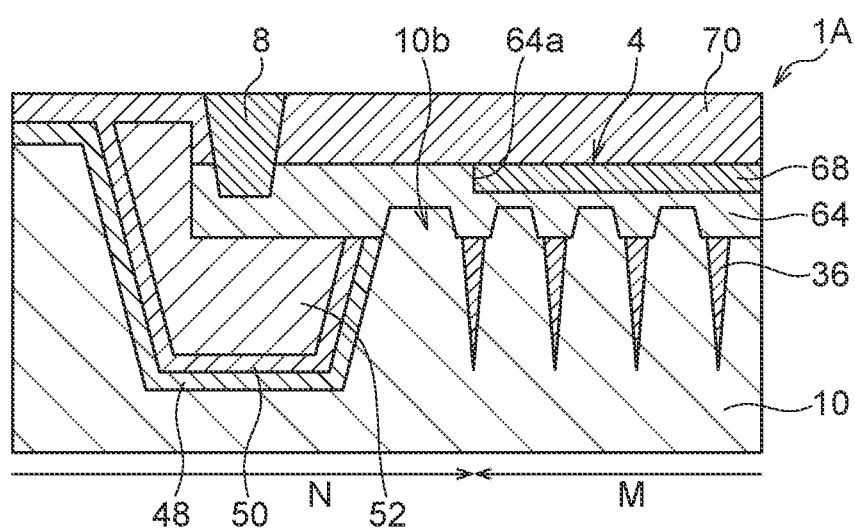
Figure 15C:
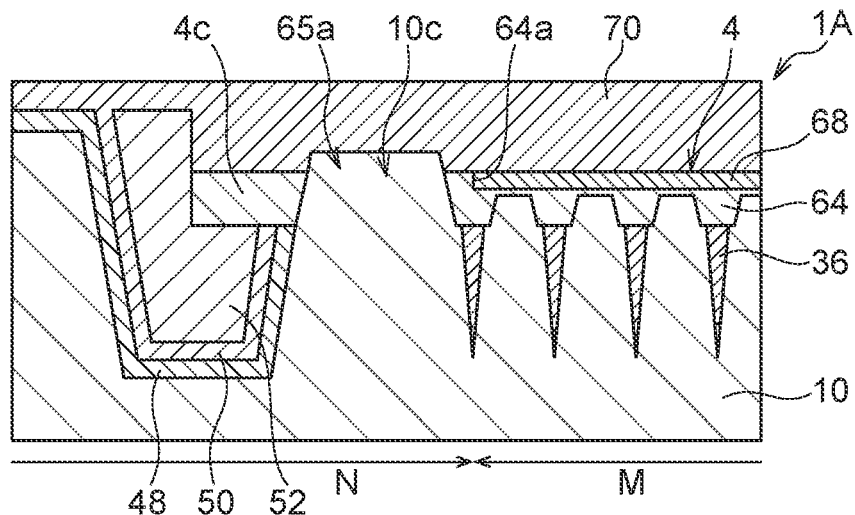
Figure 15D:
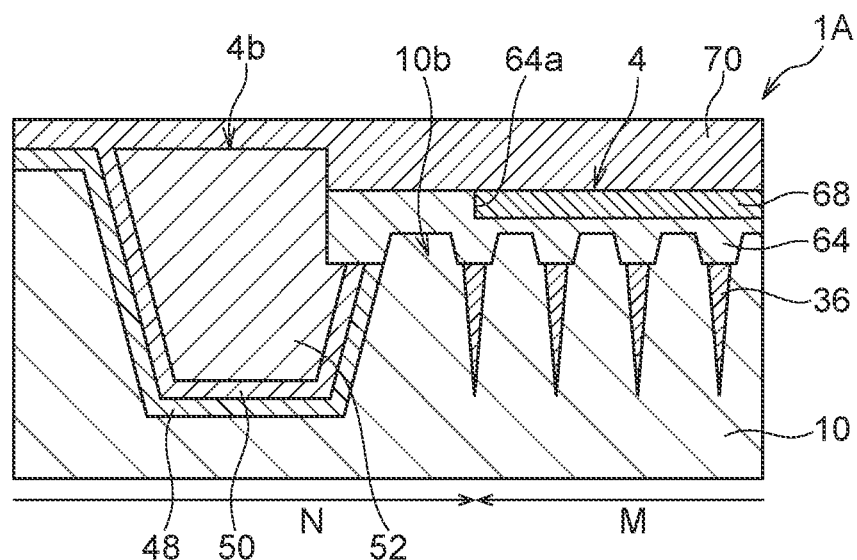
Figure 15E:
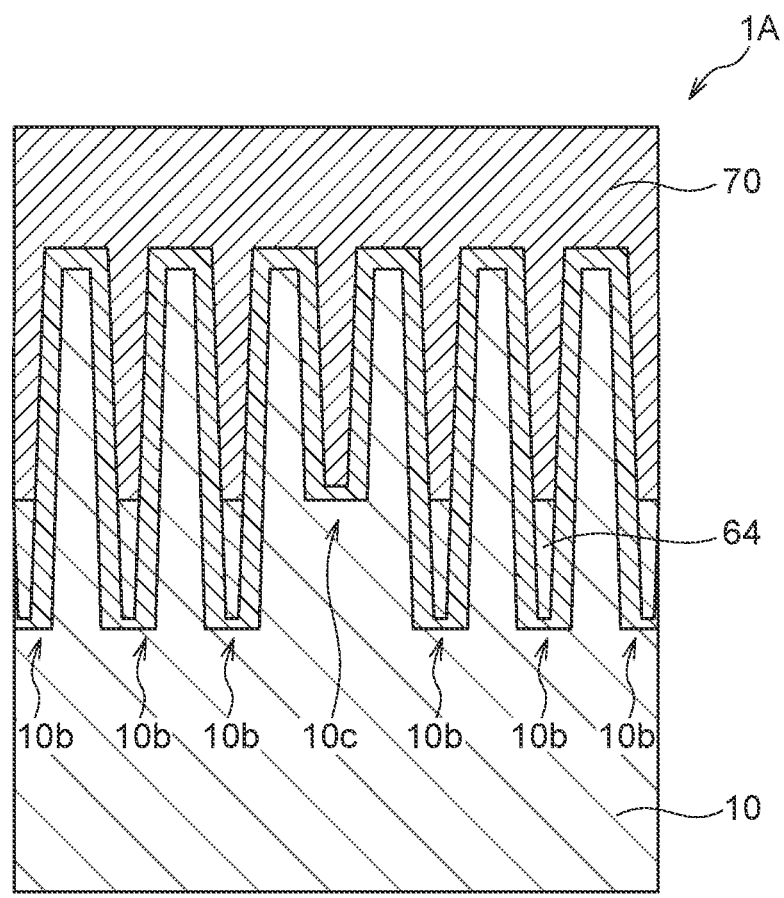
Figure 15F:
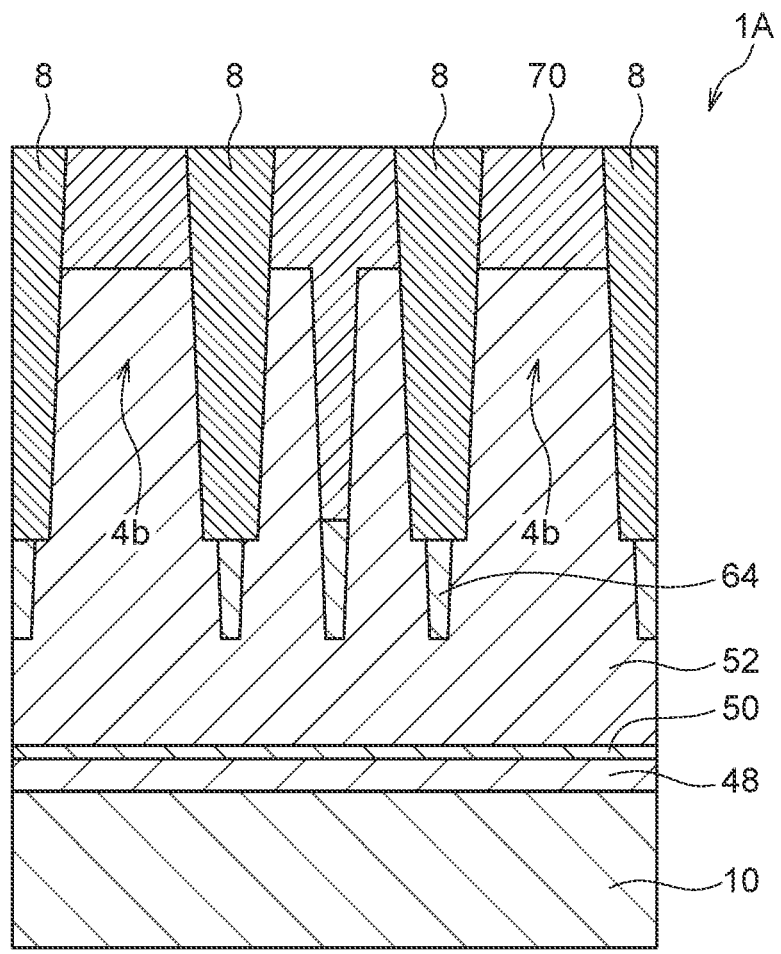

According to the semiconductor device 1A and a method of forming the same according to the first embodiment, the following effects are obtained. As illustrated in FIG. 15A, in the peripheral region N, the word-line contacts 8 are connected to every other word-line 4. The word-line contacts 8 in the memory mat end region Y are not connected to the word-lines 4 that are connected to the word-line contacts 8 in the memory mat end region X. The word-line contacts 8 in the memory mat end region Y are connected to the word-lines 4 that are not connected to the word-line contacts 8 in the memory mat end region X.

In the memory mat end region X, the first portion 4a where the word-lines 4 do not exist is provided closer to the memory cell region M than the positions where the word-line contacts 8 of the adjacent word-lines 4 are provided. The word-line 4 and the offcut 4c are isolated physically and electrically by the first portion 4a. The offcut 4c is electrically floating. In the memory mat end region X, the second portion 4b where the word-lines 4 do not exist is provided in the regions adjacent to the word-line contacts 8.

The word-line 4 having the second portion 4b and two word-lines 4 connected to the word-line contacts 8 exist between the word-lines 4 having the first portion 4a. The word-line 4 having the first portion 4a and two word-lines 4 having neither the first portion 4a nor the second portion 4b exist between the word-lines 4 having the second portion 4b. The word-line contacts 8 are connected to the two word-lines 4 having neither the first portion 4a nor the second portion 4b.

By configuring the word-lines 4 in this way, even if the position of one of the word-line contacts 8 is misaligned, the word-line contact 8 does not contact anything on the second portion 4b side, and even if the word-line contact 8 contacts the offcut 4c, the offcut 4c is not connected to any of the word-lines 4. With this arrangement, even if the positions of the word-line contacts 8 are misaligned, a short with the adjacent word-lines 4 can be avoided or reduced. Consequently, the manufacturing yield of the semiconductor device 1A can be improved.

In addition, according to the semiconductor device 1A and a method of forming the same according to the first embodiment, the first portion 4a where the word-lines 4 are not formed is formed by the existence of the projection 10c. The projection 10c is formed by using the projection 44b provided in the resist 44 illustrated in FIGS. 9A and 9C as a model. In other words, the first portion 4a is formed on the basis of the projection 44b of the resist 44.

On the other hand, the second portion 4b where the word-lines 4 are not formed is formed by using the projection 60a provided in the resist 60 illustrated in FIGS. 12A and 12D as a mask to transfer a pattern to the underlying material. In other words, the second portion 4b is formed by using the projection 60a, of the resist 60 as a model. Consequently, even if the first portion 4a and the second portion 4b are closer to each other than the lithographic resolution limit, the patterning of the first portion 4a and the second portion 4b is still possible because the portions are formed in separate lithography steps.

In addition, according to the semiconductor device 1A and a method of forming the same according to the first embodiment, the first portion 4a where the word-lines 4 are not formed is formed by using the projection 44b of the resist 44 as a model, as described above. Also, three word-lines 4 are disposed and an adequate distance is provided between two of the first portions 4a. Consequently, because sufficient distance between multiple projections 44b that act as the models of the patterns for the first portions 4a can be provided and the lithographic resolution limit is not exceeded, it is possible to avoid a phenomenon whereby the first portion 4a cannot be patterned or the like.

In addition, according to the semiconductor device 1A and a method of forming the same according to the first embodiment, the second portion 4b where the word-lines 4 are not formed is formed by using the projection 60a of the resist 60 as a model, as described above. Also, three word-lines 4 are disposed and an adequate distance is provided between two of the second portions 4b. Consequently, because sufficient distance between multiple projections 60a that act as the models of the patterns for the second portions 4b can be provided and the lithographic resolution limit is not exceeded, it is possible to avoid a phenomenon whereby the second portion 4b cannot be patterned or the like.

Second Embodiment

Hereinafter, the semiconductor device 1B and a method of forming the same according to the second embodiment will be described with reference to FIGS. 1 to 4 and FIGS. 16A to 26F. In the description of the method of forming the semiconductor device according to the second embodiment, the processes performed in FIGS. 16A to 16C of the second embodiment are the same as the processes performed in FIGS. 5A and 5B of the first embodiment.

Figure 17A:
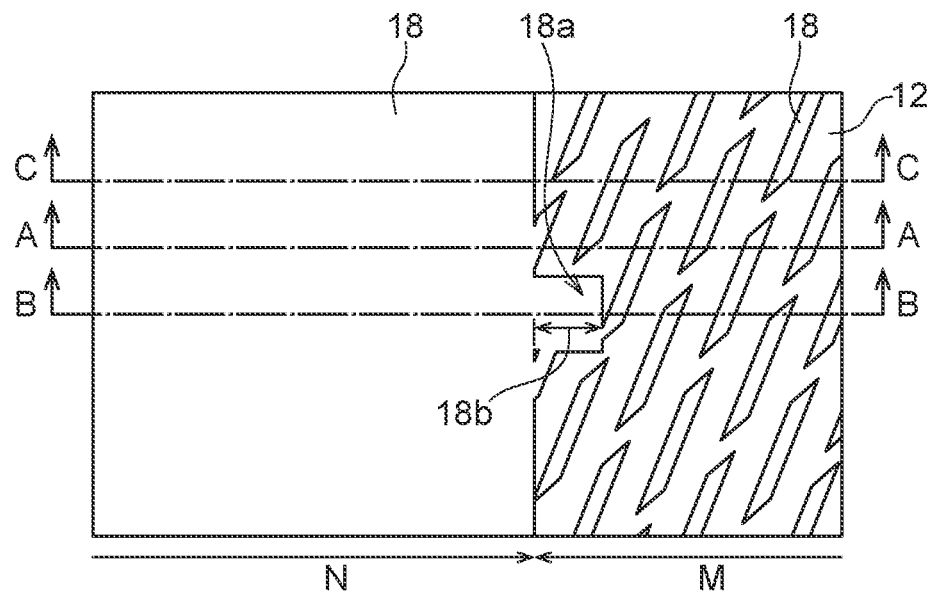
FIGS. 17A to 17C are diagrams illustrating a method of forming the semiconductor device according to the second embodiment, and illustrate an example of the schematic configuration in an exemplary process stage following the process stage illustrated in FIGS. 16A to 16C.
Figure 17B:
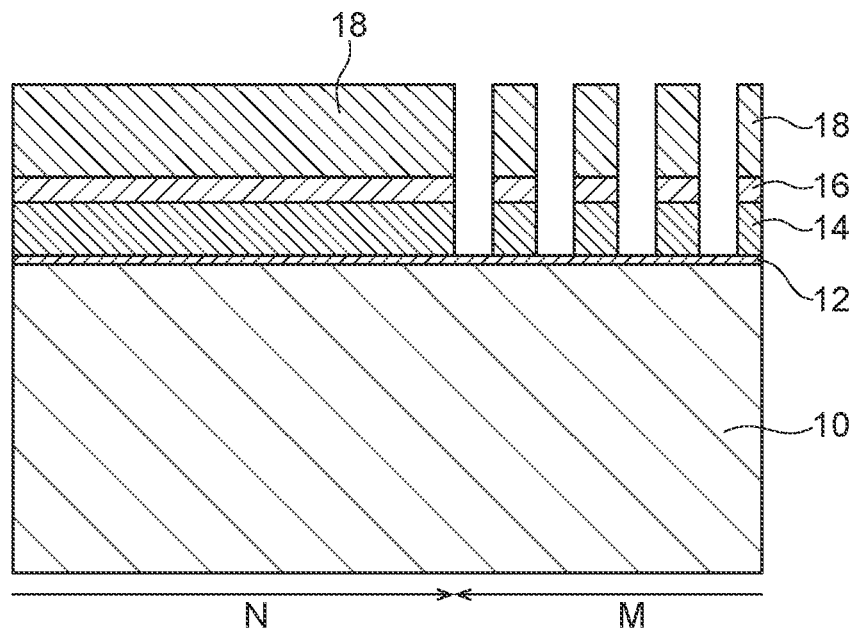
Figure 17C:
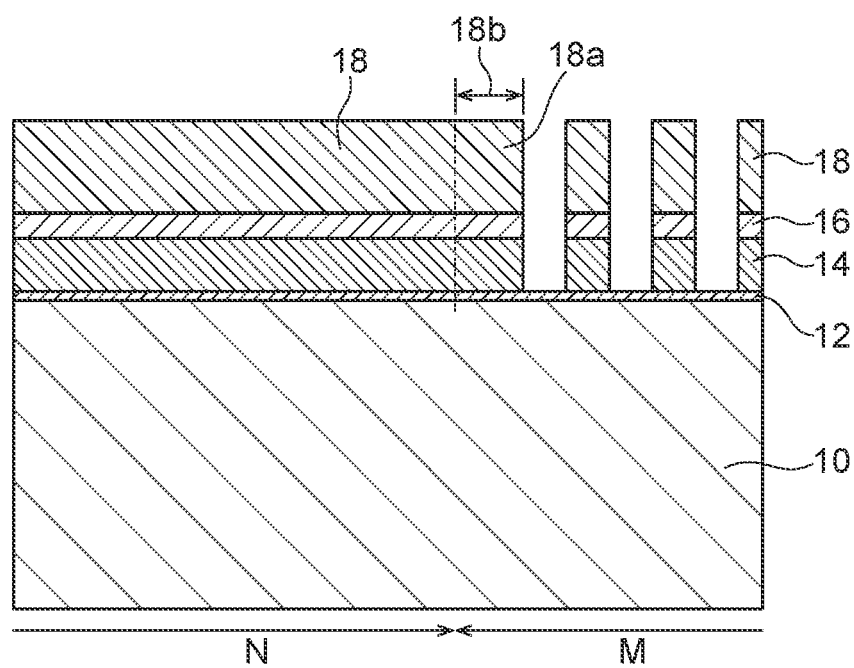
Figure 18A:
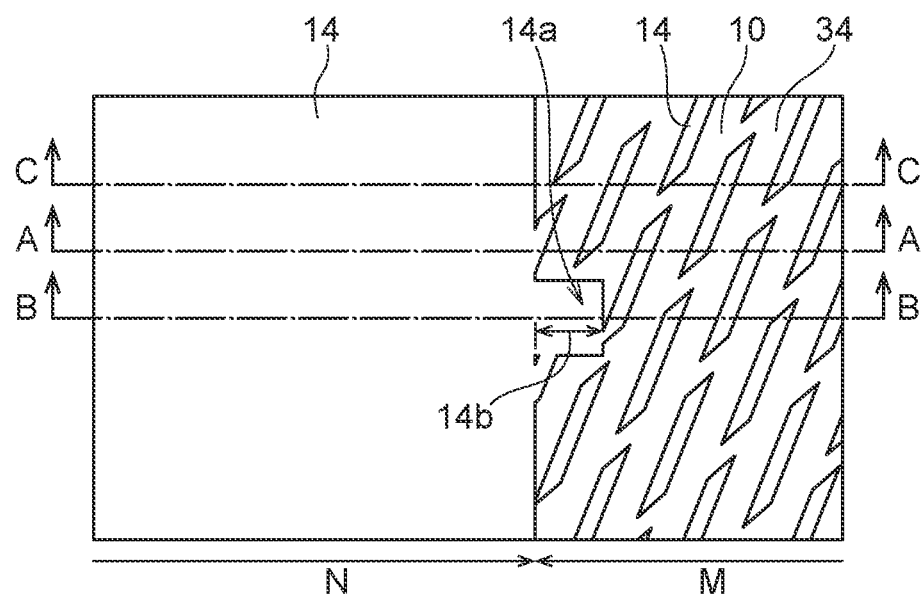
FIGS. 18A to 18C are diagrams illustrating a method of thrilling the semiconductor device according to the second embodiment, and illustrate an example of the schematic configuration in an exemplary process stage following the process stage illustrated in FIGS. 17A to 17C.
Figure 18B:
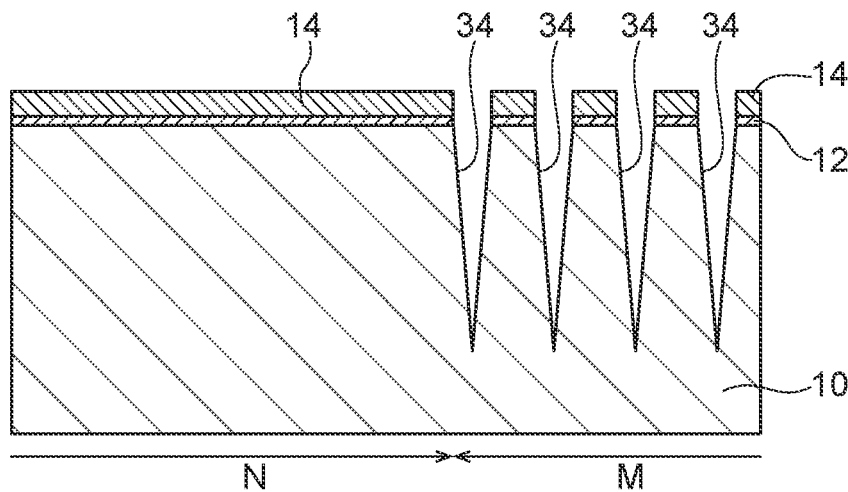
Figure 18C:
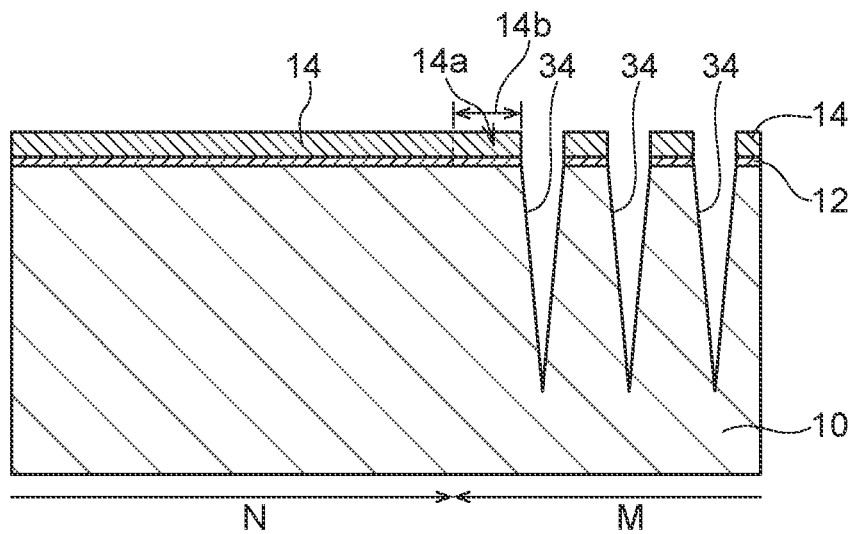
Figure 19A:
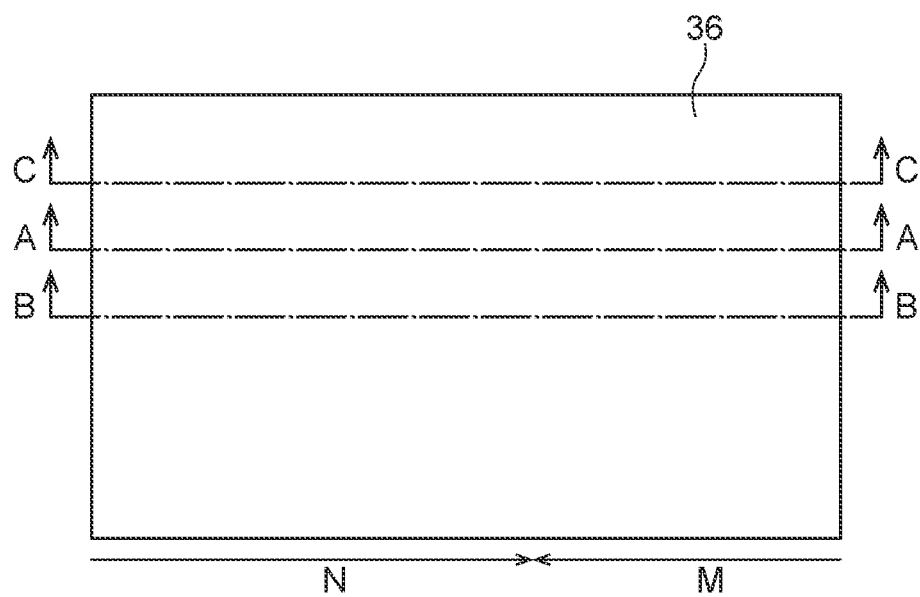
FIGS. 19A to 19C are diagrams illustrating a method of forming the semiconductor device according to the second embodiment, and illustrate an example of the schematic configuration in an exemplary process stage following the process stage illustrated in FIGS. 18A to 18C.
Figure 19B:
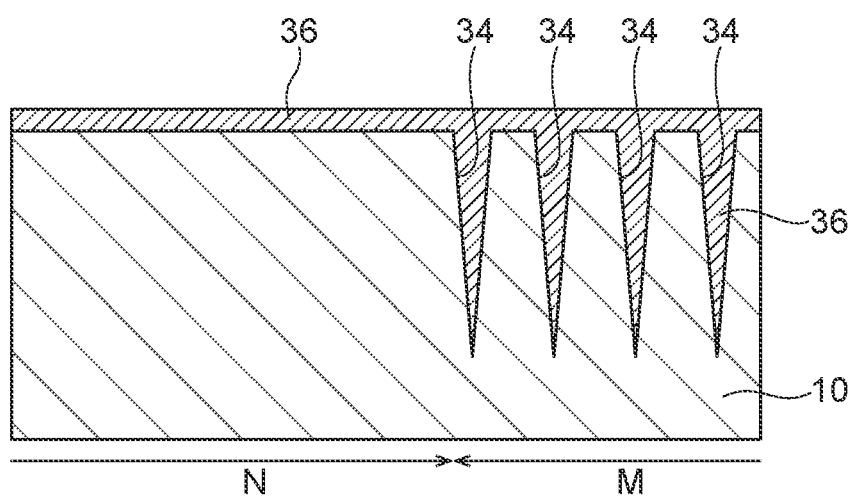
Figure 19C:
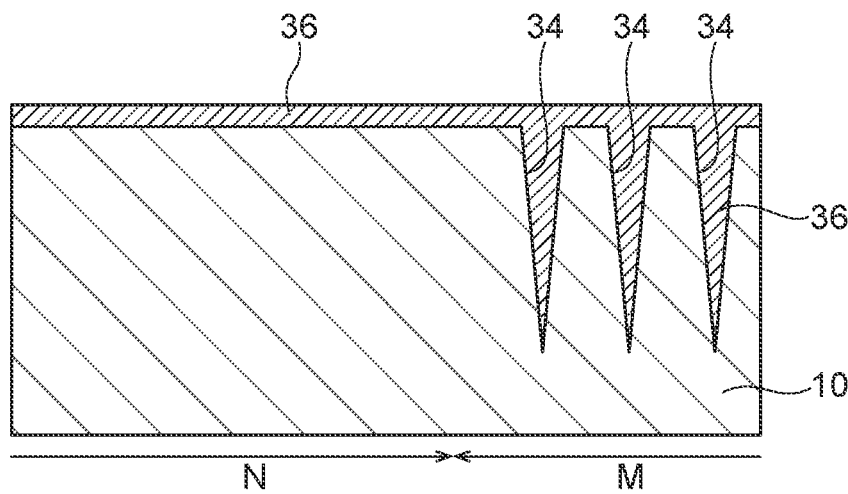

The processes performed in FIGS. 17A to 17C are the same as the processes performed in FIGS. 6A and 6B of the first embodiment. The processes performed in FIGS. 18A to 18C are the same as the processes performed in FIGS. 7A and 7B of the first embodiment. The processes performed in FIGS. 19A to 19C are the same as the processes performed in FIGS. 8A and 8B of the first embodiment.

Figure 20A:
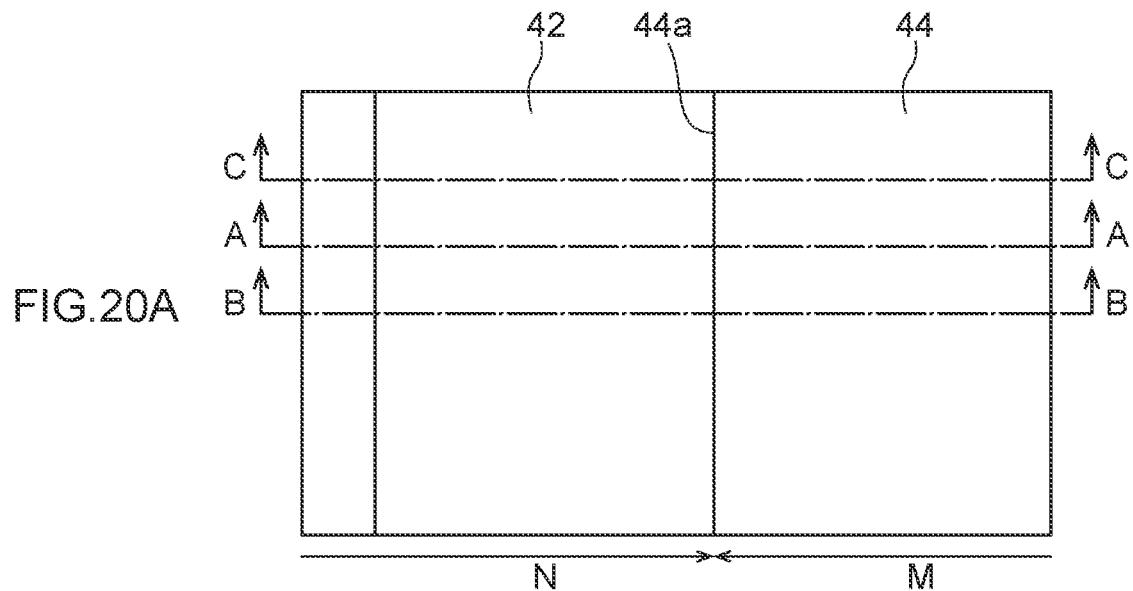
Figure 20B:
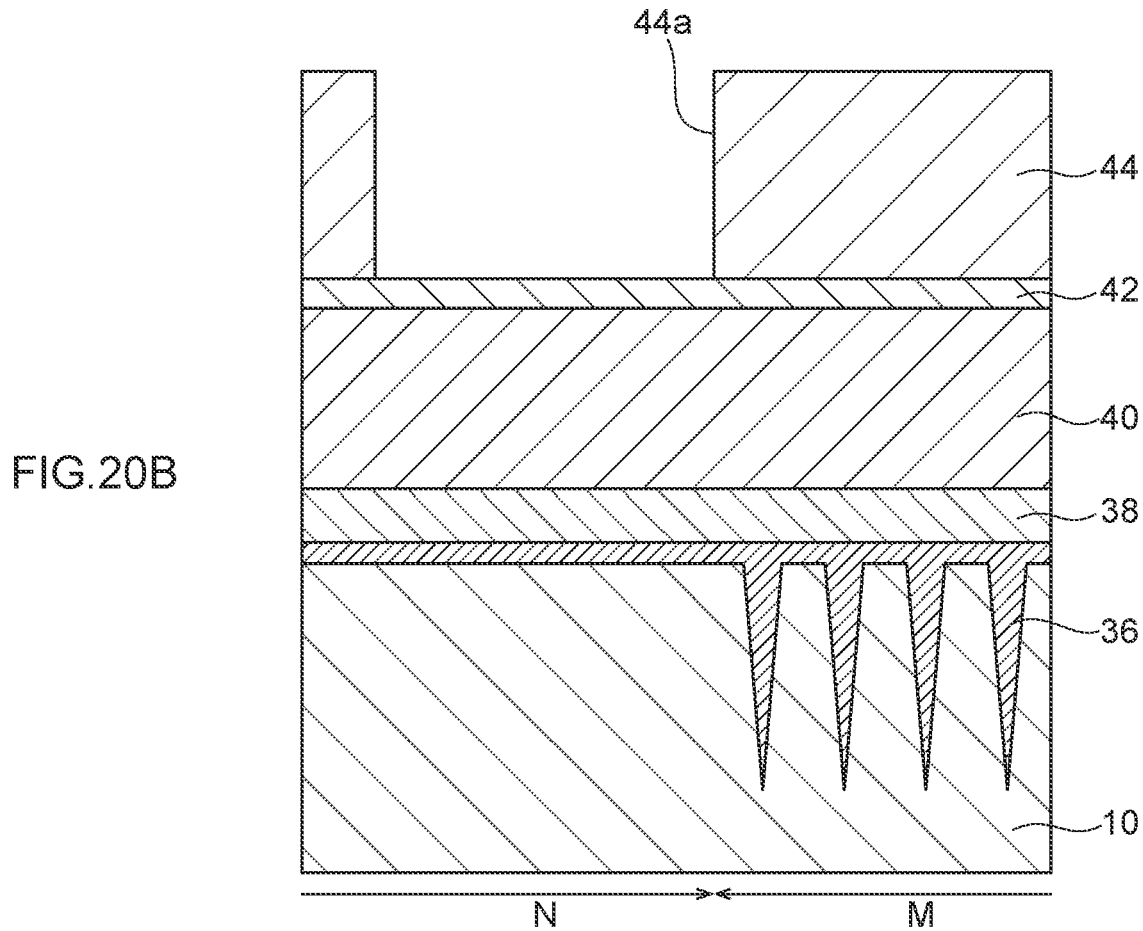
Figure 21A:
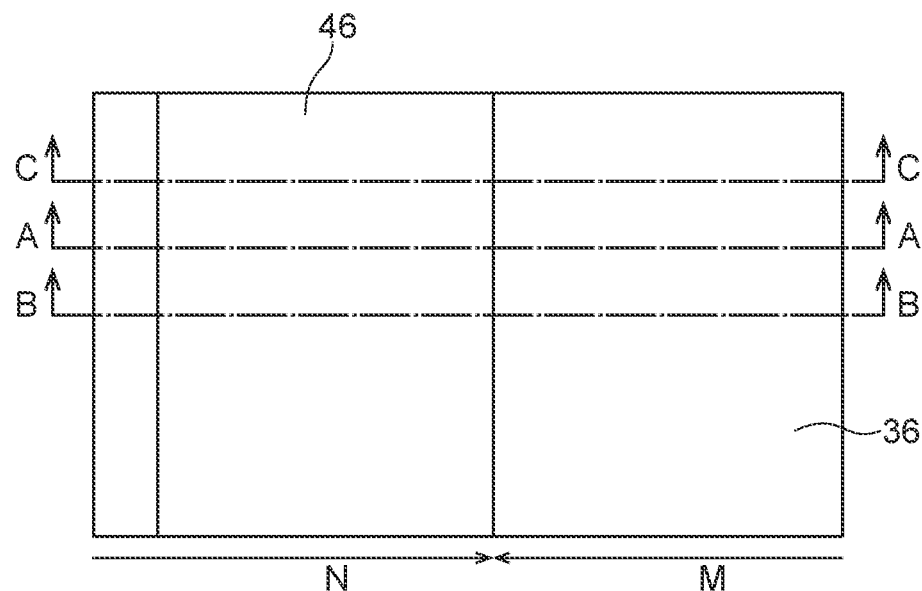
FIGS. 21A to 21C are diagrams illustrating a method of forming the semiconductor device according to the second embodiment, and illustrate an example of the schematic configuration in an exemplary process stage following the process stage illustrated in FIGS. 20A to 20C.
Figure 21B:
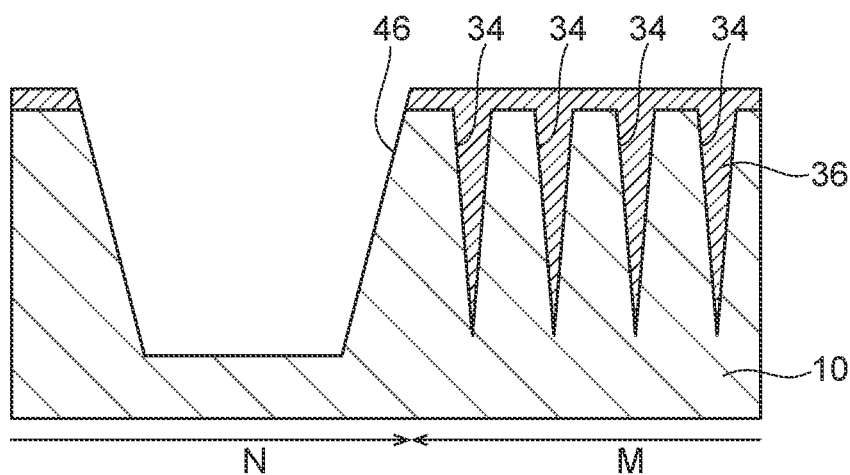
Figure 21C:
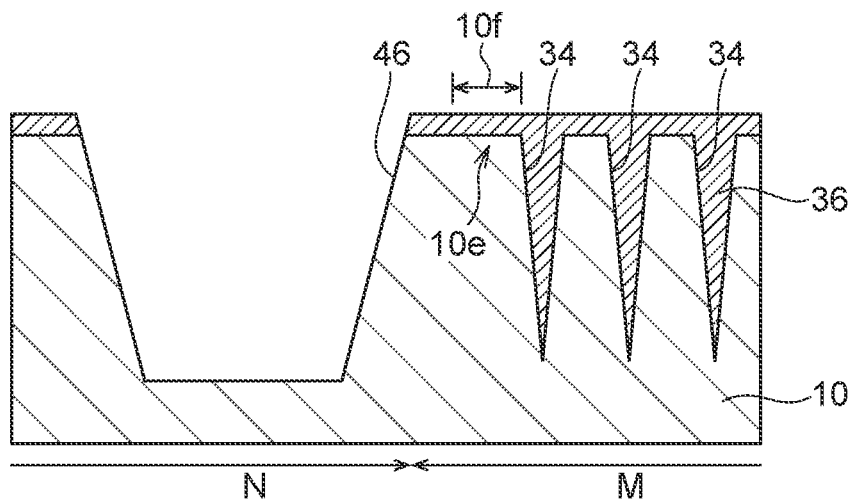
Figure 22A:
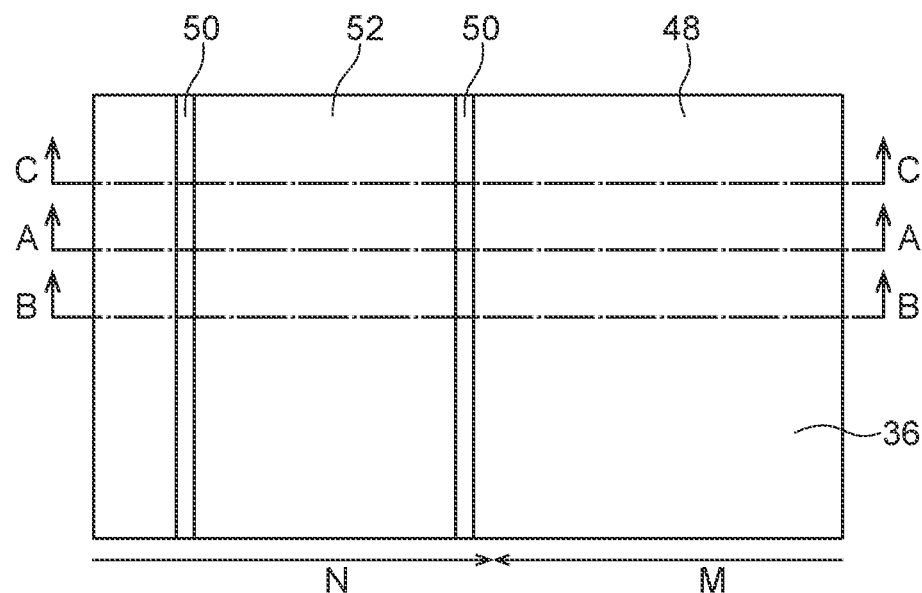
FIGS. 22A to 22C are diagrams illustrating a method of forming the semiconductor device according to the second embodiment, and illustrate an example of the schematic configuration in an exemplary process stage following the process stage illustrated in FIGS. 21A to 21C.
Figure 22B:
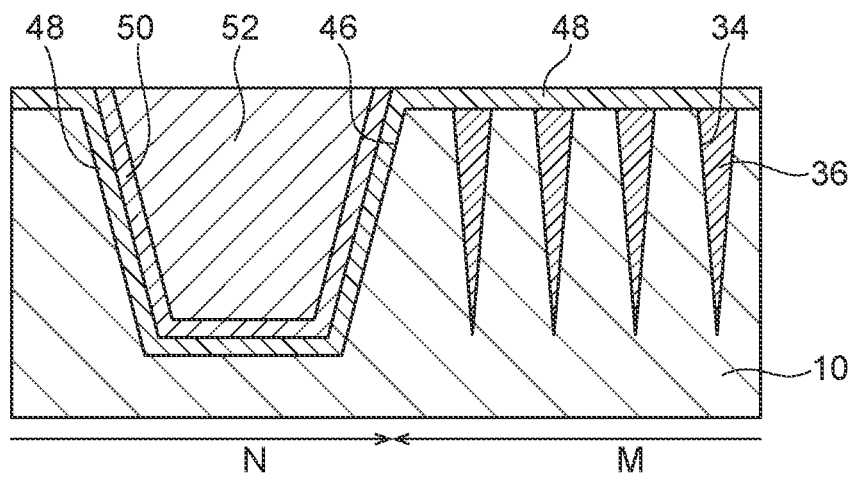
Figure 22C:
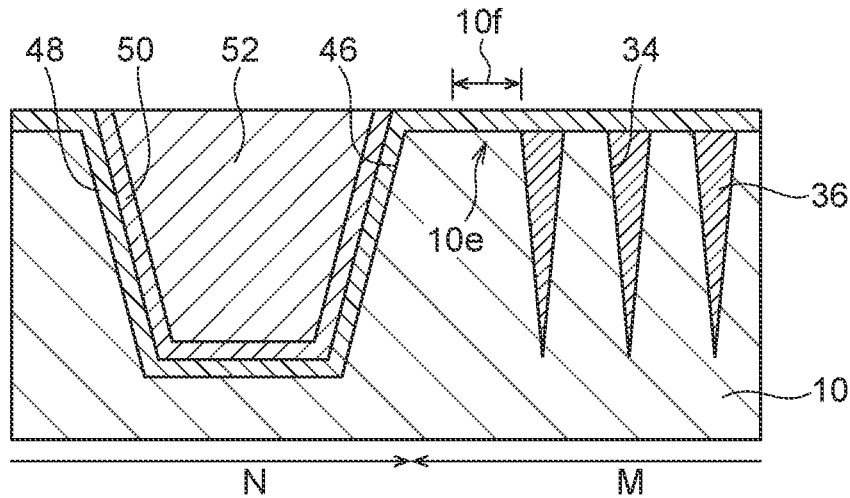

The processes performed in FIGS. 20A to 20C are the same as the processes performed in FIGS. 9A to 9C of the first embodiment. The processes performed in FIGS. 21A to 21C are the same as the processes performed in FIGS. 10A to 10C of the first embodiment. The processes performed in FIGS. 22A to 22C are the same as the processes performed in FIGS. 11A to 11C of the first embodiment.

The processes performed FIGS. 23A to 23D are the same as the processes performed in FIGS. 12A to 12E of the first embodiment. The processes performed in FIGS. 24A to 24D are the same as the processes performed in FIGS. 13A to 13D of the first embodiment. The processes performed in FIGS. 25A to 25E are the same as the processes performed in FIGS. 14A to 14E of the first embodiment. The processes performed in FIGS. 26A to 26F are the same as the processes performed in FIGS. 15A to 15F of the first embodiment.

A plan-view layout of the semiconductor device 1 (1B) according to the second embodiment is illustrated in FIGS. 1 to 3. Also, a longitudinal section view illustrating an example of an overall schematic configuration of a memory cell region in the semiconductor device 1 (1B) according to the second embodiment is illustrated in FIG. 4. The configuration of the semiconductor device 1B according to the second embodiment illustrated in FIGS. 1 to 4 is similar to that of the semiconductor device 1A according to the first embodiment.

The semiconductor device 1B and a method of forming the same according to the second embodiment will be described with reference to FIGS. 16A to 26F. FIGS. 16A to 26F are diagrams that sequentially illustrate a schematic configuration of the memory mat end region X illustrated in FIG. 1A.

Figure 16A:
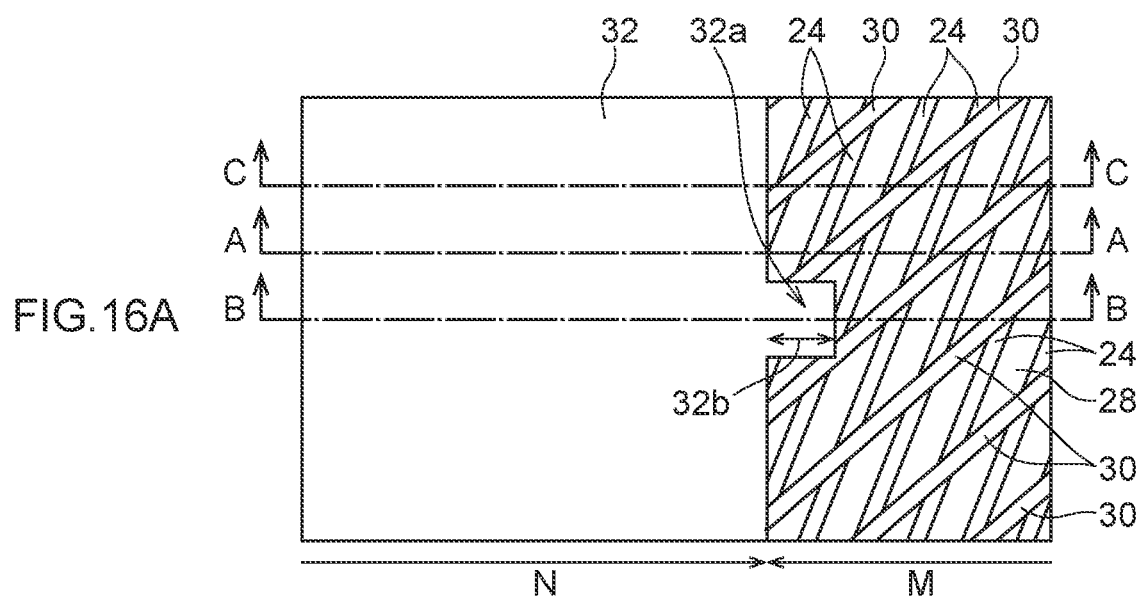
FIGS. 16A to 16C are diagrams illustrating a method of forming the semiconductor device according to the second embodiment, and illustrate an example of the schematic configuration an exemplary process stage.
Figure 16B:
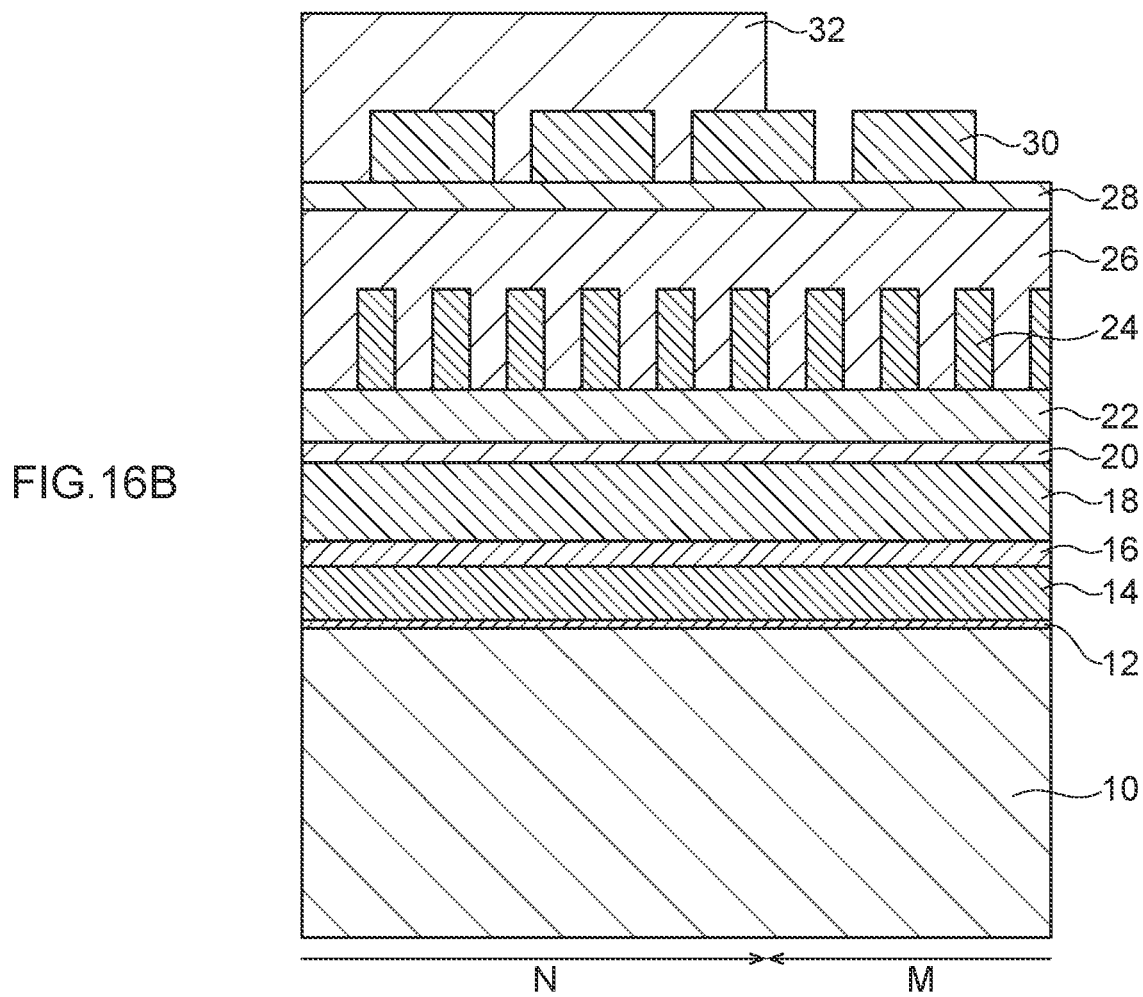

First, a method of forming the semiconductor device 1B according to the second embodiment will be described. As illustrated in FIGS. 16A and 16B, processes similar to the processes described with reference to FIGS. 5A and 5B in the first embodiment are performed.

Figure 16C:
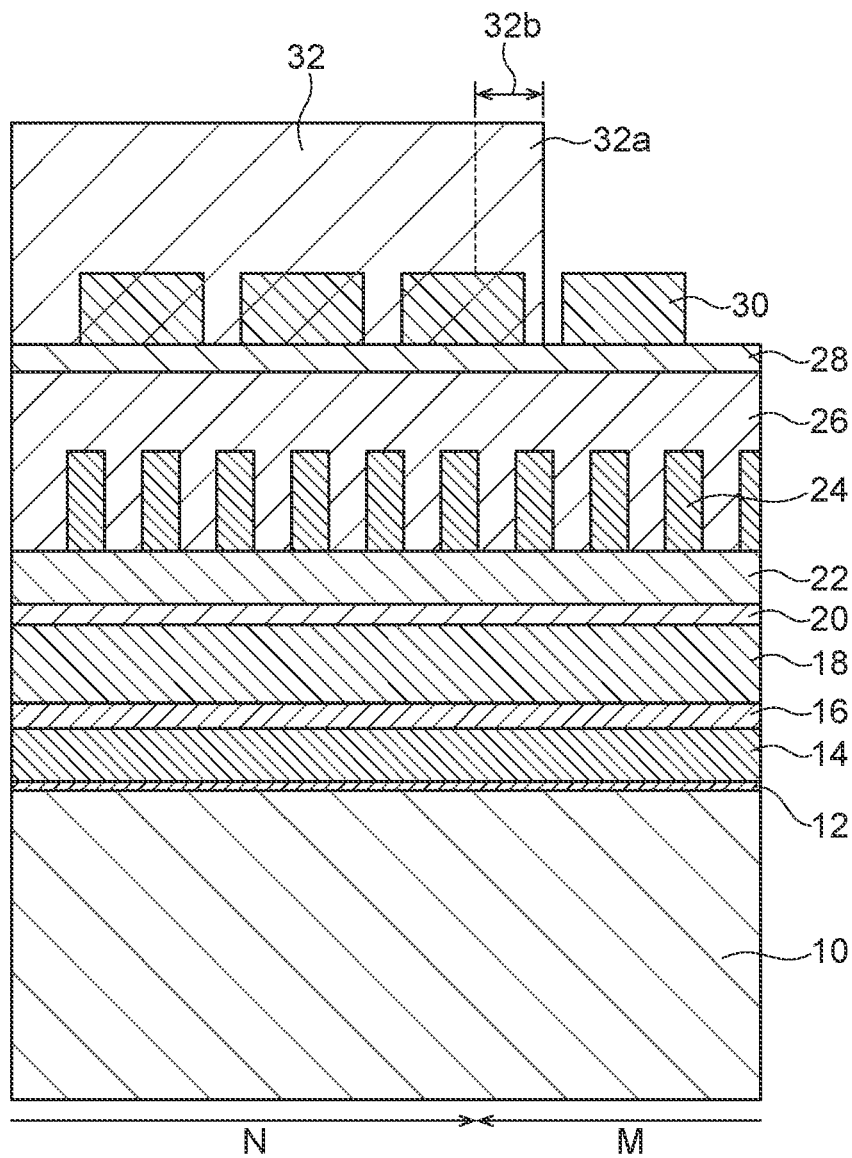

As illustrated in FIGS. 16A and 16C, in the portion along the line B-B, the resist 32 has a projection 32*a* that projects toward the memory cell region M. The projection 32*a* has a predetermined projection length 32*b*. Otherwise, the configuration is substantially the same as the configuration illustrated in FIGS. 5A and 5B of the first embodiment.

Next, as illustrated in FIGS. 17A to 17C, processes similar to the processes described with reference to FIGS. 6A and 6B in the first embodiment are performed. Anisotropic dry etching is performed on the memory cell region M. This causes the superimposed pattern of the resist 32, the ninth insulating films 30, and the polysilicon films 24 to be transferred onto the sixth insulating film 22, the fifth insulating film 20, the fourth insulating film 18, the third insulating film 16, and the second insulating film 14. Thereafter, the polysilicon films 24, the sixth insulating film 22, and the fifth insulating film 20 are removed.

As illustrated in FIGS. 17A, 17B, and 17C, this step causes the pattern of the resist 32 having the projection 32*a* illustrated in FIG. 16A and the like to be transferred onto the fourth insulating film 18, the third insulating film 16, and the second insulating film 14. With this arrangement, a projection 18*a* having a projection length 18*b* is formed in the portion along the line B-B, as illustrated in FIGS. 17A and 17C.

Next, as illustrated in FIGS. 18A to 18C, processes similar to the processes described with reference to FIGS. 7A and 7B in the first embodiment are performed. With this step, the pattern of the projection 18*a* is transferred onto the second insulating film 14, the first insulating film 12, and the semiconductor substrate 10, and a projection 14*a* having a projection length 14*b* is formed.

Next, as illustrated in FIGS. 19A and 19B, processes similar to the processes described with reference to FIGS. 8A and 8B in the first embodiment are performed. The configuration illustrated in FIGS. 19A and 19B is substantially the same as the configuration illustrated in FIGS. 8A and 8B of the first embodiment.

Next, as illustrated in FIGS. 20A to 20C, processes similar to the processes described with reference to FIGS. 9A to 9C in the first embodiment are performed. As illustrated in FIGS. 20A and 20C, in the method of forming the semiconductor device 1B according to the second embodiment, the resist 44 does not have the projection 44*b* illustrated in FIG. 9A and the like. The rest of the configuration is similar to the configuration illustrated in FIGS. 9A to 9C of the first embodiment.

Next, as illustrated in FIGS. 21A to 21C, processes similar to the processes described with reference to FIGS. 10A to 10C in the first embodiment are performed. As illustrated in FIG. 21C, in a longitudinal section view in the portion along the line B-B, a projection 10*e* is transferred by using the projection 32*a* illustrated in FIGS. 16A and 16C as a model. Consequently, a projection length 10*f* of the projection 10*e* is formed to reflect the projection length 32*b* illustrated in FIGS. 16A and 16C.

The rest of the configuration is substantially similar to the configuration illustrated in FIGS. 10A to 10C of the first embodiment.

Next, as illustrated in FIGS. 22A to 22C, processes similar to the processes described with reference to FIGS. 11A to 11C in the first embodiment are performed. The configuration illustrated in FIGS. 22A to 22C is substantially the same as the configuration illustrated in FIGS. 11A to 11C of the first embodiment.

Figure 23A:
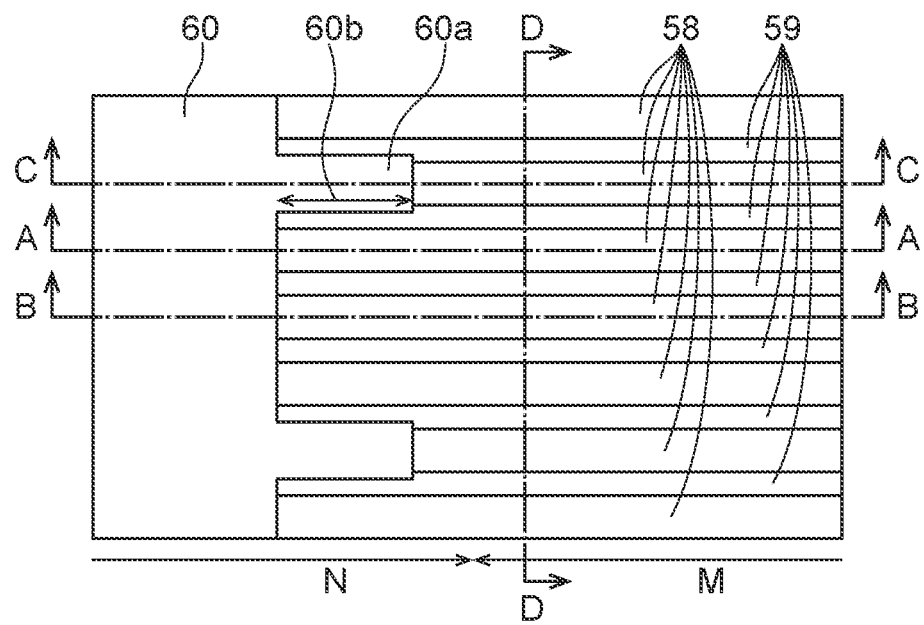
FIGS. 23A to 23D are diagrams illustrating a method of forming the semiconductor device according to the second embodiment, and illustrate an example of the schematic configuration in an exemplary process stage following the process stage illustrated in FIGS. 22A to 22C.
Figure 23B:
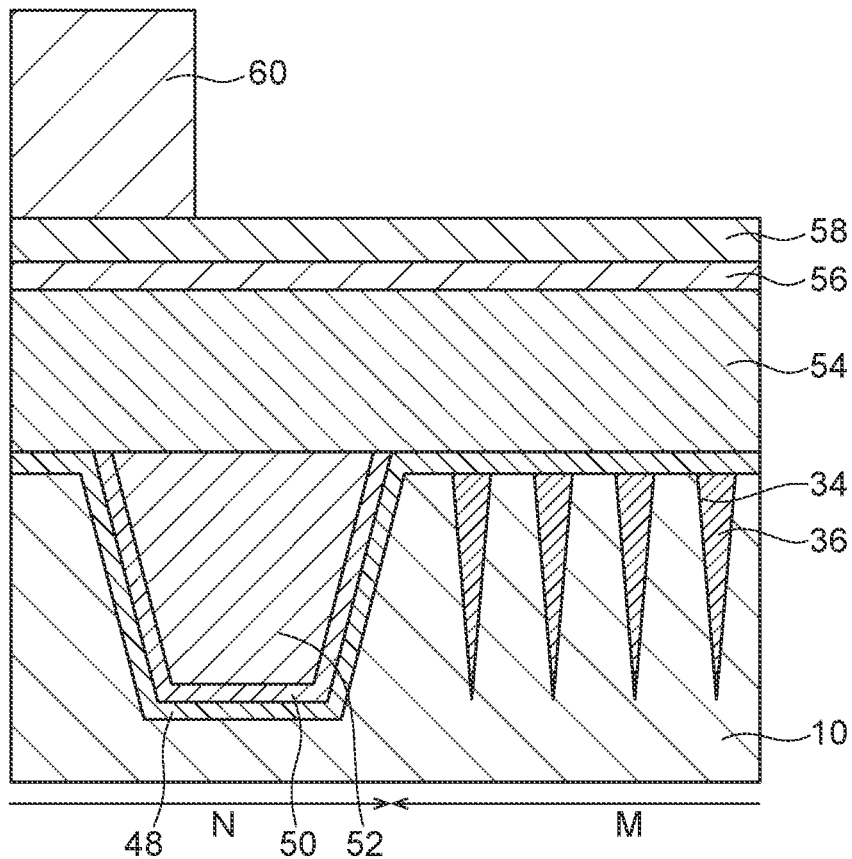
Figure 23C:
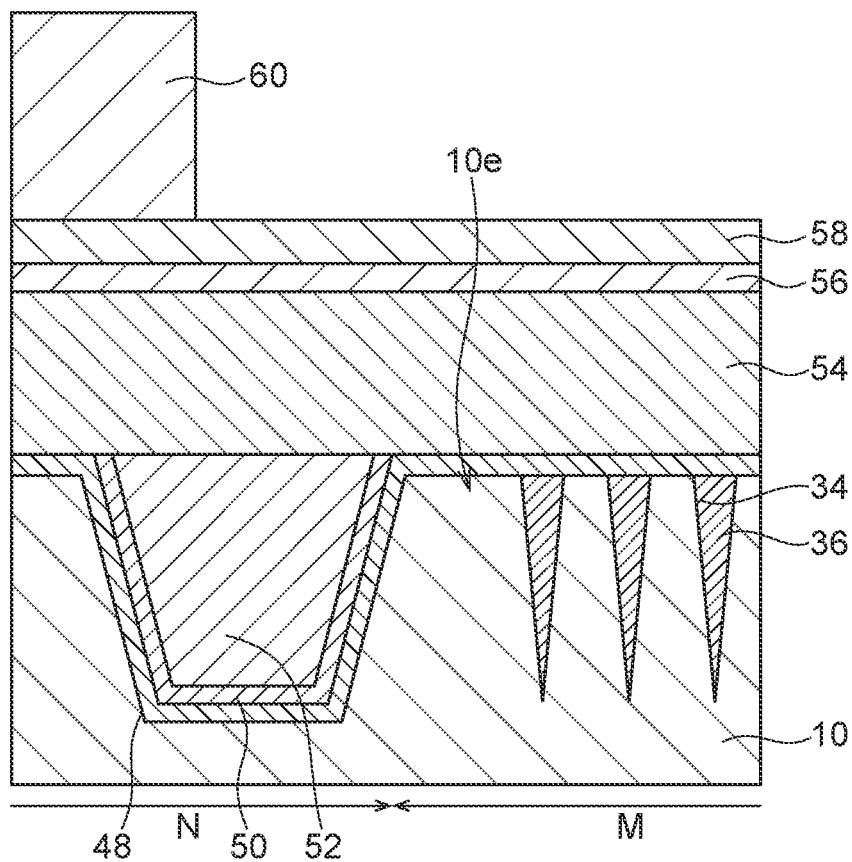

Next, as illustrated in FIGS. 23A to 23D, processes similar to the processes described with reference to FIGS. 12A to 12E in the first embodiment are performed. As illustrated ire FIGS. 23A and 23D, the resist 60 has the projection 60*a* that projects out in the direction of the memory cell region M by the projection length 60*h*. The rest of the configuration is substantially the same as that of the first embodiment. The configuration in the portion along the line D-D in FIG. 23A is substantially the same as the configuration illustrated in FIG. 12E.

Next, as illustrated in FIGS. 24A to 24D, processes similar to the processes described with reference to FIGS. 13A to 13D in the first embodiment are performed. The anisotropic dry etching causes the straight trench 62 to be formed in the region not covered by the resist 60 having the projection 60*a* and also the hard mask 59. A conductive material is buried in the trench 62 in a later step, and the buried conductive material functions as the DRAM word-line 4 (e.g., the word-line 4 is embedded in the trench 62). Next, the resist 60, and, the 17th insulating film 54, the 18th insulating film 56, the 19th insulating film 58, and the 14th insulating film 48 on the top face of the semiconductor substrate 10 in the regions are removed.

Figure 24A:
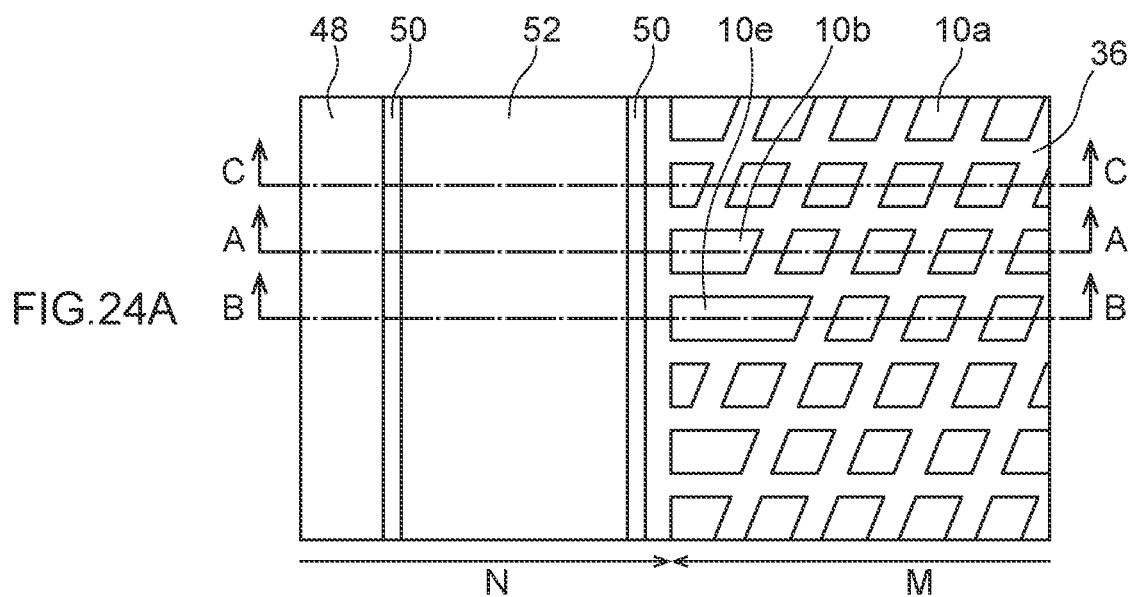
FIGS. 24A to 24D are diagrams illustrating a method of forming the semiconductor device according to the second embodiment, and illustrate an example of the schematic configuration in an exemplary process stage following the process stage illustrated in FIGS. 23A to 23D.
Figure 24B:
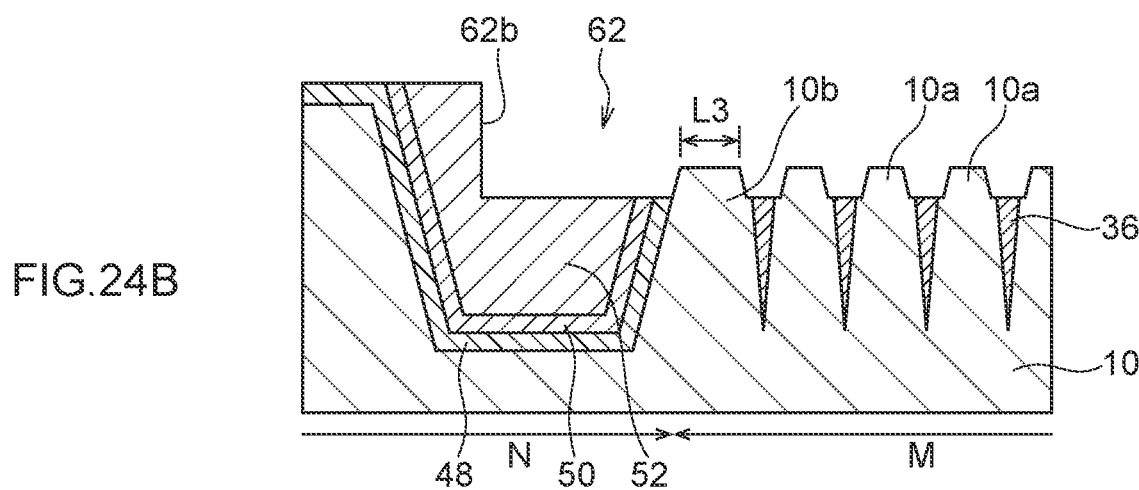
Figure 24C:
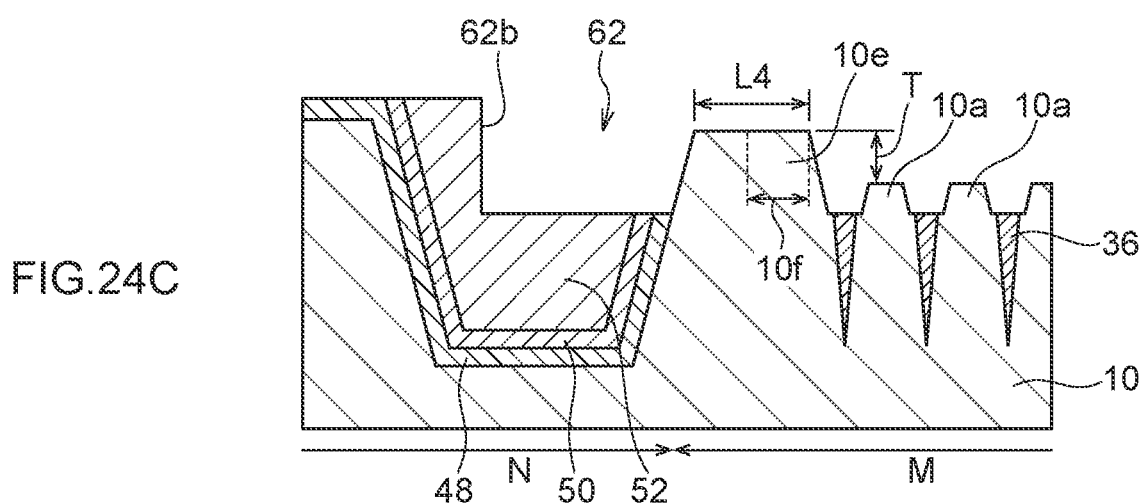
Figure 24D:
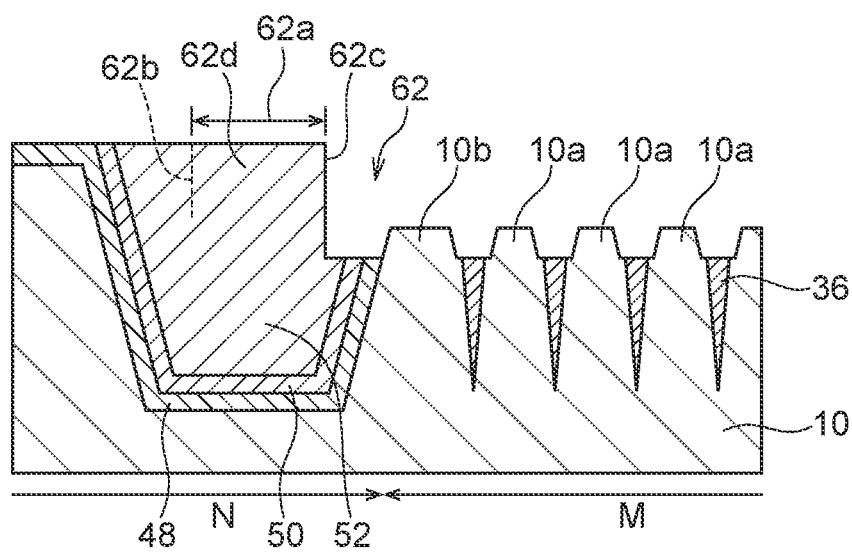
Figure 25A:
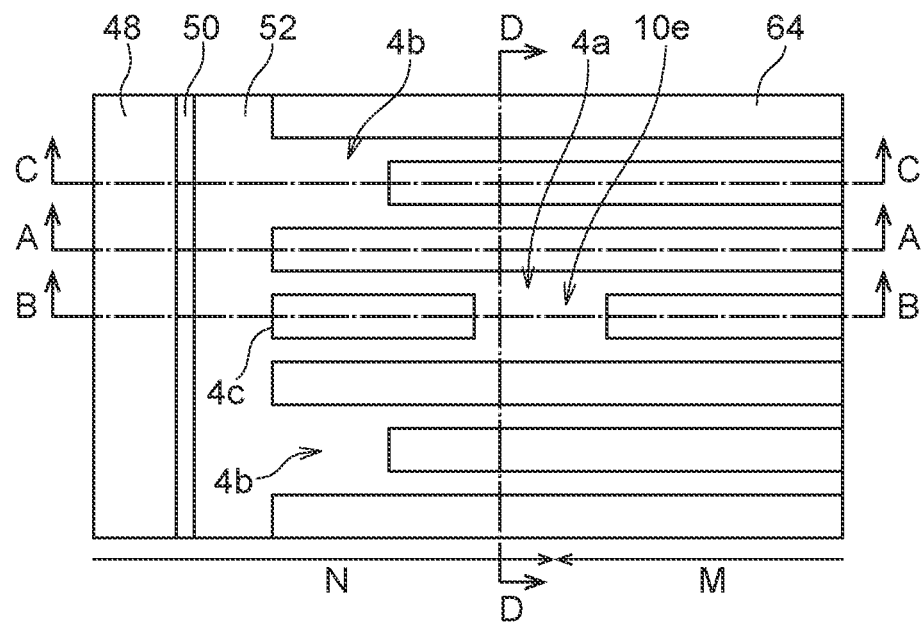
FIGS. 25A to 25E are diagrams illustrating a method of forming the semiconductor device according to the second embodiment, and illustrate an example of the schematic configuration in an exemplary process stage following the process stage illustrated in FIGS. 24A to 24D.
Figure 25B:
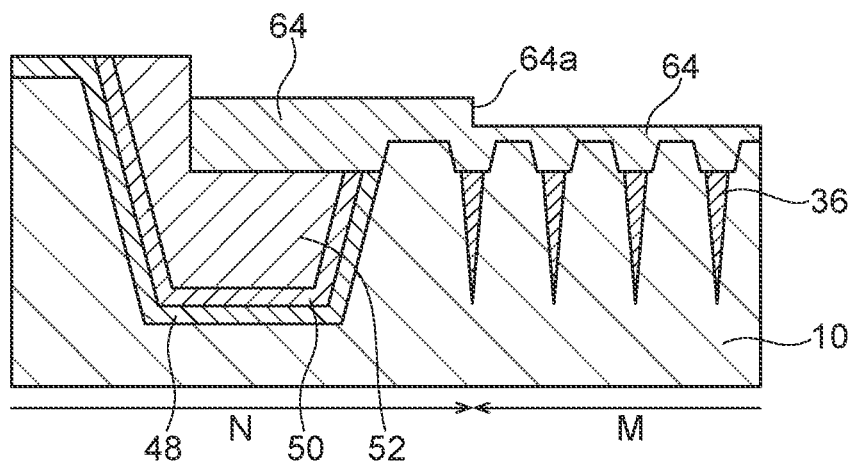
Figure 25C:
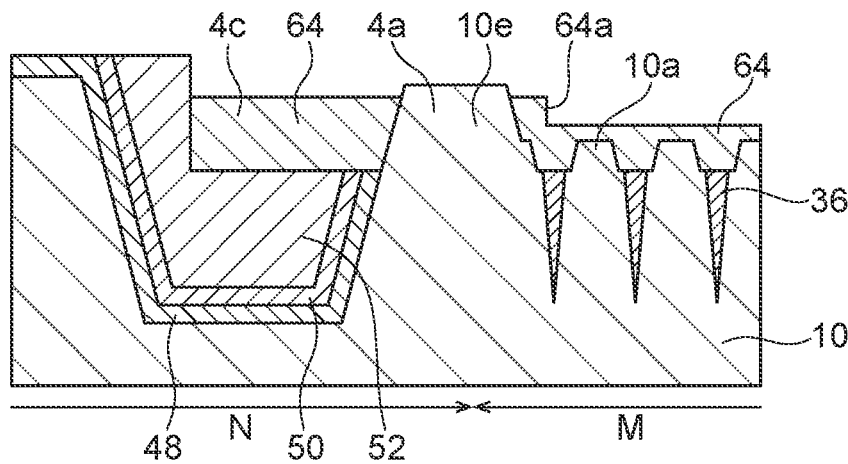
Figure 25D:
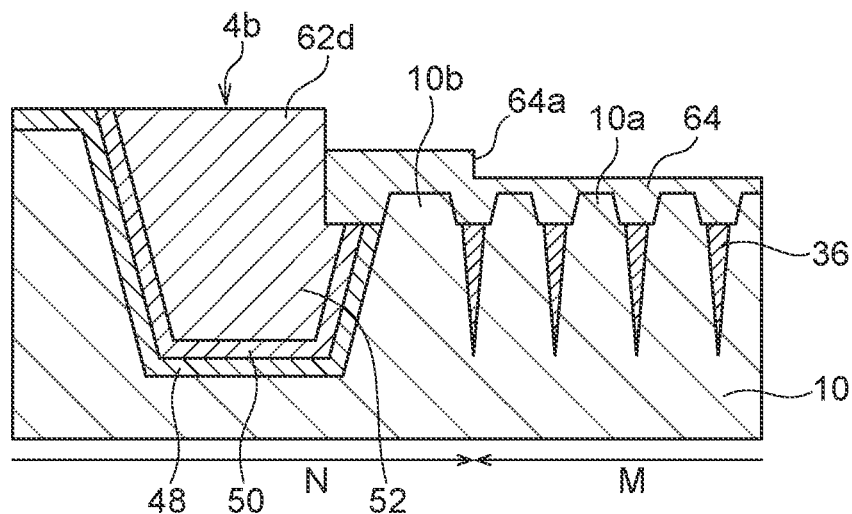
Figure 25E:
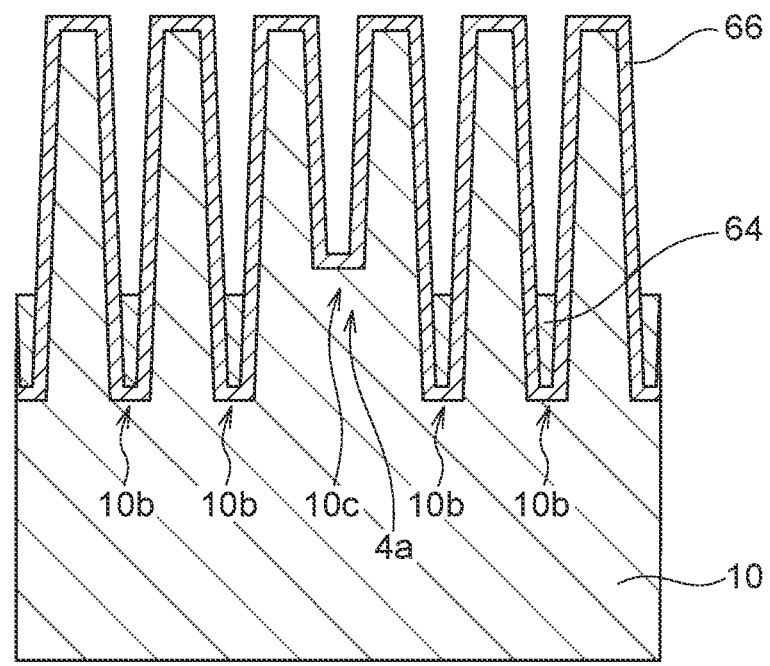
Figure 26A:
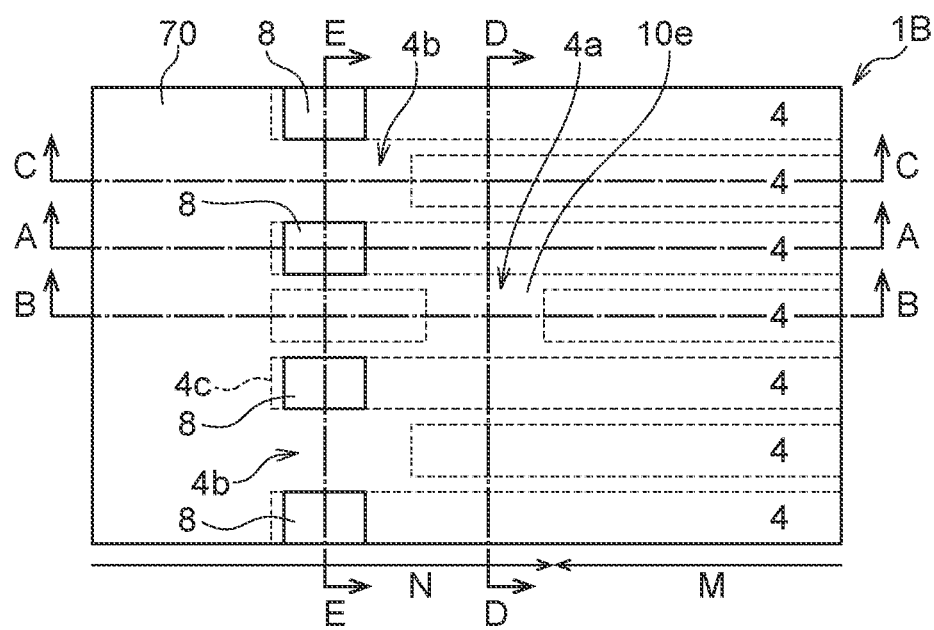
Figure 26B:
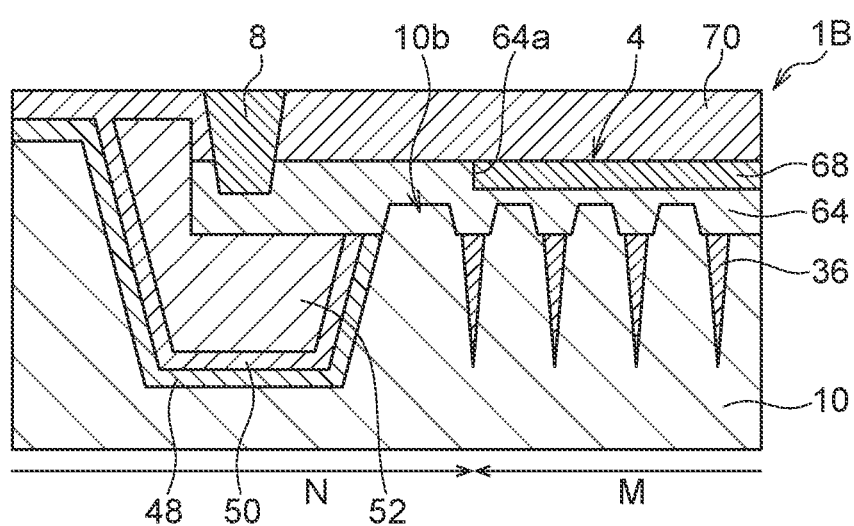
Figure 26C:
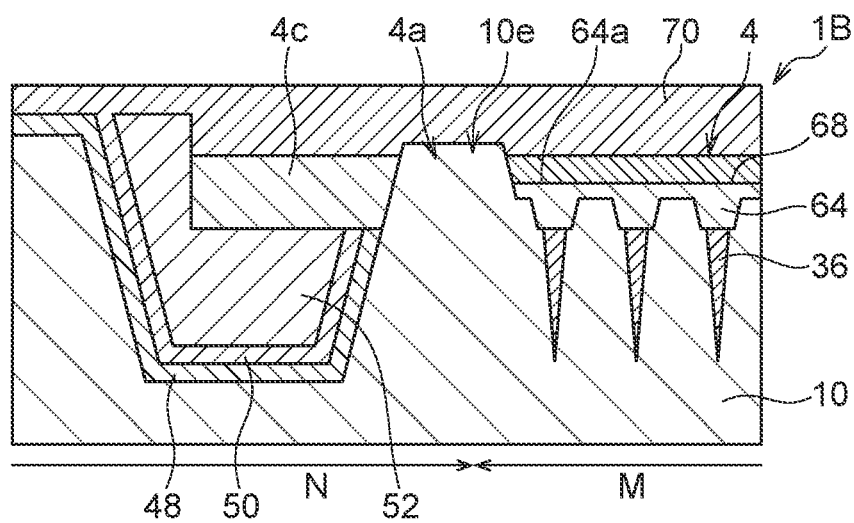
Figure 26D:
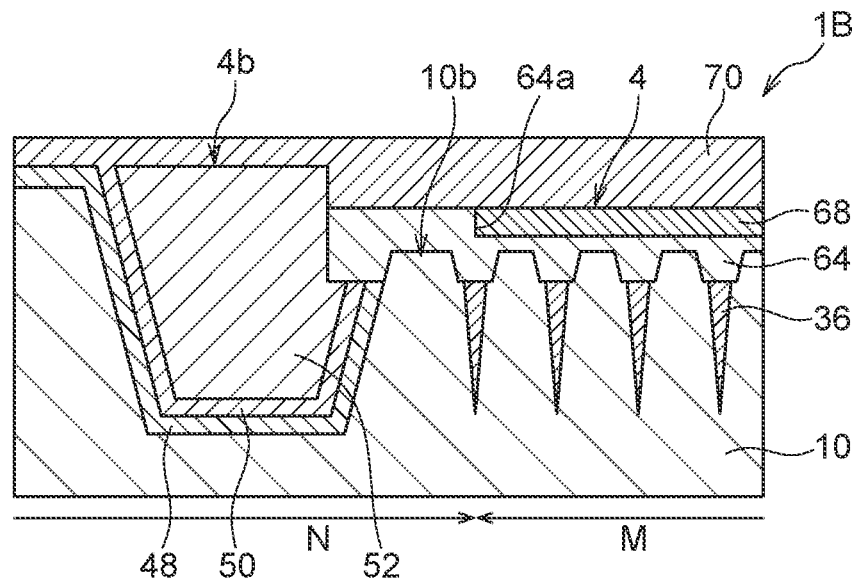
Figure 26E:
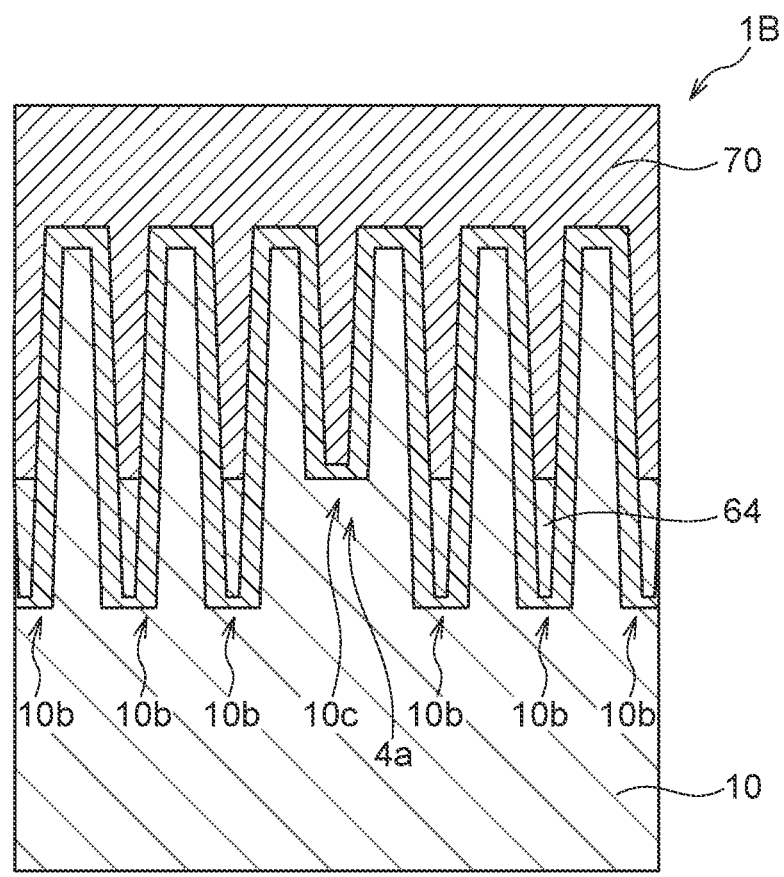

As illustrated in FIGS. 24B to 24D, the trench 62 having the shape of the resist 60 transferred thereto is formed in the peripheral region N by the dry etching. Also, as illustrated in FIG. 24C, the projection 10*e* projects out farther than the edge 10*b* by the projection length 10*f* at a position along the line B-B. Consequently, the length L2 of the projection 10*e* is longer than the length L3 of the edge 10*b* illustrated in FIG. 24B. In other words, because the projection 10*e* is long, the surface of the projection 10*e* does not retreat due to the above dry etching, the top face of the projection 10*e* is formed at a position higher than the top face of the active regions 10*a* by a height difference T, and the projection 10*e* projects upward.

The height difference T depends on the length L4 of the projection 10*e*. An optimal value for the length L4 of the projection 10*e* that is sufficient to obtain the necessary height difference T can be found by using a test element group (TEG) chip for testing in which projections 10*e* having various lengths L4 are formed, for example.

Also, as illustrated in FIG. 24D, in the portion along the line C-C in FIG. 24A, the projection 60*a* of the resist 60 illustrated in FIG. 23A is transferred and patterned onto the 16th insulating film 52 and the like to obtain a configuration similar to that of FIG. 13D.

Next, as illustrated in FIGS. 25A to 25E, processes similar to the processes described with reference to FIGS. 14A to 14E in the first embodiment are performed. The configuration illustrated in FIGS. 25A to 25E is substantially the same as the configuration illustrated in FIGS. 14A to 14E of the first embodiment.

Next, as illustrated in FIGS. 26A to 26F, processes similar to the processes described with reference to FIGS. 15A to 15F in the first embodiment are performed. The configuration illustrated in FIGS. 26A to 26F is substantially the same as the configuration illustrated in FIGS. 15A to 15F of the first embodiment.

According to the semiconductor device 1B and a method of forming the same according to the second embodiment, effects similar to the semiconductor device 1A and a method of forming the same according to the first embodiment are obtained.

In addition, according to the semiconductor device 1B and a method of forming the same according to the second embodiment, the first portion 4*a* where the word-lines 4 are not formed is formed by the existence of the projection 10*e*. The projection 10*e* is formed by being transferred using the projection 32a provided in the resist 32 illustrated in FIGS. 16A and 16C as a model. In other words, the first portion 4a is formed by using the projection 32a of the resist 32 as a model.

Figure 23D:
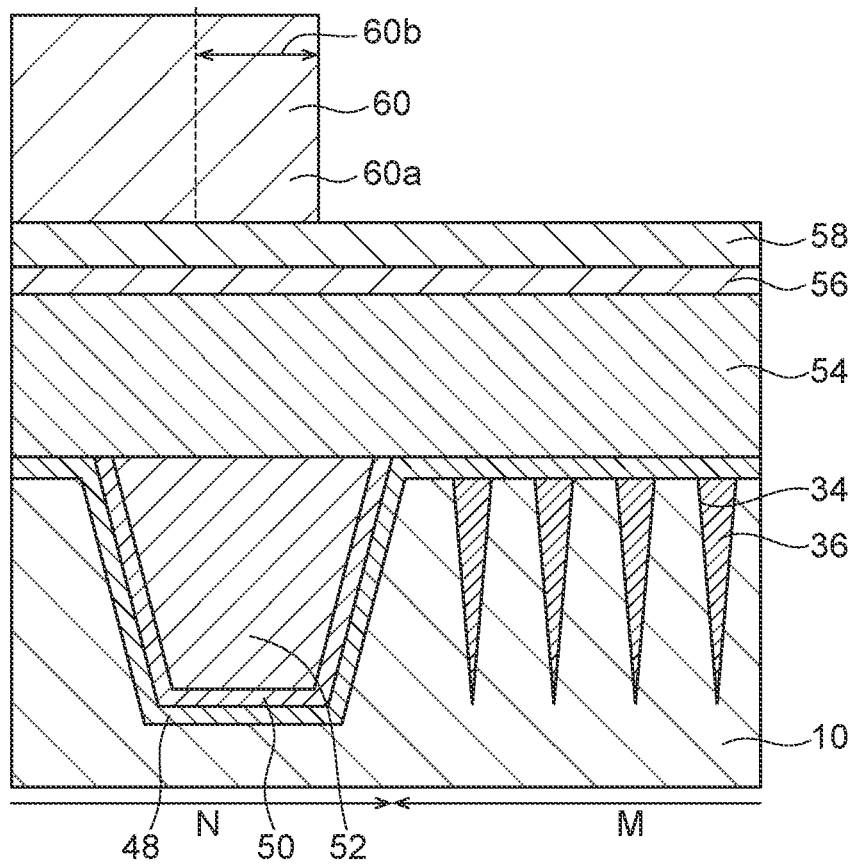

On the other hand, the second portion 4b where the word-lines 4 are not formed is formed by using the projection 60a provided in the resist 60 illustrated in FIGS. 23A and 23D as a mask to transfer a pattern to the underlying material. In other words, the second portion 4b is formed by using the projection 60a of the resist 60 as a model. Consequently, even if the first portion 4a and the second portion 4b are closer to each other than the lithographic resolution limit, a phenomenon in which patterning cannot be achieved or the like is avoidable because the portions are formed in separate lithography steps.

In addition, according to the semiconductor device 1B and a method of forming the same according to the second embodiment, the first portion 4a where the word-lines 4 are not formed is formed by using the projection 32a of the resist 32 as a model, as described above. Also, three word-lines 4 are disposed between two of the first portions 4a, and an adequate distance is provided between two of the first portions 4a. Consequently, because sufficient distance between multiple projections 32a that act as the models of the patterns for the first portions 4a can be provided, it is possible to remain at or below the lithographic resolution limit and avoid a phenomenon in which patterning cannot be achieved or the like.

In addition, according to the semiconductor device 1B and a method of forming the same according to the second embodiment, the second portion 4b where the word-lines 4 are not formed is formed by using the projection 60a of the resist 60 as a model, as described above. Also, three word-lines 4 are disposed and an adequate distance is provided between two of the second portions 4b. Consequently, because sufficient distance between multiple projections 60a that act as the models of the patterns for the second portions 4b can be provided, it is possible to remain at or below the lithographic resolution limit and avoid a phenomenon in which patterning cannot be achieved or the like.

As above, DRAM is described as an example of the semiconductor device 1 (1A, 1B) according to the embodiments, but the above description is merely one example and not intended to be limited to DRAM. Memory devices other than DRAM, such as static random access memory (SRAM), flash memory, erasable programmable read only memory (EPROM), magnetoresistive random access memory (MRAM), and phase-change memory for example can also be applied as the semiconductor device 1.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A semiconductor device comprising:
   a substrate;
   a memory cell region;
   a peripheral region adjacent to the memory cell region;
   a plurality of word-lines extending across the memory cell region and the peripheral region; and
   a plurality of contacts connected to edge portions of even numbered ones of the plurality of word-lines in the peripheral region, respectively;
   wherein a side of each of the edge portions of the even numbered ones of the plurality of word-lines is adjacent a portion missing an odd numbered word-line; and
   wherein another side of each of the edge portions of some of the even numbered ones of the plurality of word-lines is adjacent an offcut of another odd numbered word-line.

2. The semiconductor device of claim 1, further comprising:
   an additional peripheral region, wherein the memory cell region is arranged between the peripheral and the additional peripheral regions and the plurality of word-lines extend over the additional peripheral region; and
   a plurality of additional contacts connected to edge portions of odd numbered ones of the plurality of word-lines in the additional peripheral region, respectively;
   wherein a side of each of the edge portions of the odd numbered ones of the plurality of word-lines is adjacent a portion missing an even numbered word-line; and
   wherein another side of each of the edge portions of some of the odd numbered ones of the plurality of word-lines is adjacent an additional offcut of another even numbered word-line.

3. The semiconductor device of claim 1, wherein the offcut is electrically floating.

4. The semiconductor device of claim 2, wherein the additional offcut is electrically floating.

5. The semiconductor device of claim 1, wherein the memory cell region includes a plurality of memory cells.

6. The semiconductor device of claim 5, wherein each of the plurality of word-lines is paired with corresponding memory cells of the plurality of memory cells to control accesses to the corresponding memory cells of the plurality of memory cells.

7. The semiconductor device of claim 1, wherein each of the plurality of word-lines is embedded in a trench of the substrate.

8. The semiconductor device of claim 7, wherein each of the plurality of word-lines includes a conductive material.

9. A semiconductor device comprising:
   a substrate;
   a memory cell region;
   a peripheral region adjacent to the memory cell region; and
   first, second and third word-lines extending across the memory cell region and the peripheral region;
   wherein the first word-line is provided adjacently between the second and third word-lines;
   wherein a first length of the first word-line in the peripheral region is longer than a second length of the second word-line in the peripheral region;
   wherein the second length of the second word-line in the peripheral region is longer than a third length of the third word-line in the peripheral region;
   wherein a side of the edge portion of the first word-line is adjacent a portion missing the second word-line; and wherein another side of the edge portion of the first word-line is adjacent an offcut of the third word-line.

10. The semiconductor device of claim 9, further comprising a contact connected to an edge portion of the first word-line in the peripheral region.

11. The semiconductor device of claim 9, further comprising:
- a fourth word-line arranged adjacently to the third word-line, the fourth word-line having a same length as the first word-line and extending across the memory cell region and the peripheral region.

12. The semiconductor device of claim 11, further comprising:
- a fifth word-line arranged adjacently to the second word-line, the fifth word-line having the same length as the first word-line and extending across the memory cell region and the peripheral region.

13. The semiconductor device of claim 9, wherein the memory cell region includes a plurality of memory cells and a plurality of the word-lines each paired with corresponding memory cells of the plurality of memory cells.

14. The semiconductor device of claim 9, wherein each word-line is embedded in a trench provided in the substrate.

* * * * *